(12) United States Patent
Baik et al.

(10) Patent No.: US 10,211,597 B2
(45) Date of Patent: Feb. 19, 2019

(54) SEMICONDUCTOR LASER RESONATOR AND SEMICONDUCTOR LASER DEVICE INCLUDING THE SAME

(71) Applicant: SAMSUNG ELECTRONICS CO., LTD., Suwon-si (KR)

(72) Inventors: Chanwook Baik, Yongin-si (KR); Hyochul Kim, Yongin-si (KR); Yeonsang Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/134,506

(22) Filed: Apr. 21, 2016

(65) Prior Publication Data

US 2017/0093129 A1   Mar. 30, 2017

(30) Foreign Application Priority Data

Sep. 30, 2015 (KR) .................. 10-2015-0138004

(51) Int. Cl.
*H01S 5/02* (2006.01)
*H01S 5/10* (2006.01)
(Continued)

(52) U.S. Cl.
CPC .............. *H01S 5/24* (2013.01); *H01S 5/0206* (2013.01); *H01S 5/0425* (2013.01);
(Continued)

(58) Field of Classification Search
CPC .... H01S 3/0604; H01S 3/0606; H01S 5/1075; H01S 3/0608; H01S 3/0635;
(Continued)

(56) References Cited

U.S. PATENT DOCUMENTS 4,845,721 A * 7/1989 Hoffmann ............... H01S 3/025
                                                    372/34
5,343,490 A * 8/1994 McCall .................... H01S 5/18
                                                    372/43.01
(Continued)

FOREIGN PATENT DOCUMENTS

JP    2007-73999 A    3/2007
JP    2013-518429 A   5/2013
(Continued)

OTHER PUBLICATIONS

Bogdanov et al., "Mode Selection in InAs Quantum Dot Microdisk Lasers Using Focused Ion Beam Technique," Jul. 29, 2015, arXiv:1507.08159v1 [physics.optics], 1-4.*
(Continued)

*Primary Examiner* — Joshua King
(74) *Attorney, Agent, or Firm* — Sughrue Mion, PLLC

(57) ABSTRACT

A semiconductor laser resonator configured to generate a laser beam includes a gain medium layer including a semiconductor material and comprising at least one protrusion formed by at least one trench to protrude in an upper portion of the gain medium layer. In the semiconductor laser resonator, the at least one protrusion is configured to confine the laser beam as a standing wave in the at least one protrusion.

28 Claims, 32 Drawing Sheets
(7 of 32 Drawing Sheet(s) Filed in Color)

(51) Int. Cl.
| | |
|---|---|
| H01S 5/20 | (2006.01) |
| H01S 5/22 | (2006.01) |
| H01S 5/24 | (2006.01) |
| H01S 5/32 | (2006.01) |
| H01S 5/042 | (2006.01) |
| H01S 5/065 | (2006.01) |
| H01S 5/343 | (2006.01) |

(52) U.S. Cl.
CPC .......... *H01S 5/0653* (2013.01); *H01S 5/1017* (2013.01); *H01S 5/1042* (2013.01); *H01S 5/1075* (2013.01); *H01S 5/2027* (2013.01); *H01S 5/3211* (2013.01); *H01S 5/343* (2013.01); *H01S 5/1032* (2013.01); *H01S 5/1082* (2013.01); *H01S 5/22* (2013.01); *H01S 5/2205* (2013.01); *H01S 2301/16* (2013.01); *H01S 2301/176* (2013.01)

(58) Field of Classification Search
CPC ........ H01S 5/18316; H01S 5/18322–5/18336; H01S 5/18338
See application file for complete search history.

(56) References Cited

U.S. PATENT DOCUMENTS

| | | | | |
|---|---|---|---|---|
| 5,555,255 | A | | 9/1996 | Kock et al. |
| 5,825,799 | A | * | 10/1998 | Ho .................. B82Y 20/00 372/108 |
| 6,134,257 | A | * | 10/2000 | Capasso ................ H01S 3/083 372/43.01 |
| 6,400,744 | B1 | | 6/2002 | Capasso et al. |
| 6,501,783 | B1 | | 12/2002 | Capasso et al. |
| 6,668,004 | B2 | * | 12/2003 | Peterson ............... H01S 3/0606 372/92 |
| 6,785,320 | B1 | | 8/2004 | Amos et al. |
| 6,978,067 | B2 | * | 12/2005 | Herbert ................. B82Y 20/00 257/186 |
| 7,436,874 | B2 | | 10/2008 | Onishi et al. |
| 9,403,237 | B2 | * | 8/2016 | Maleki ................. B23K 26/364 |
| 2004/0233950 | A1 | | 11/2004 | Furukawa et al. |
| 2005/0249254 | A1 | * | 11/2005 | Deppe ................. H01S 5/18327 372/46.01 |
| 2007/0229197 | A1 | * | 10/2007 | Okano .................... H01P 7/082 333/219 |
| 2007/0258499 | A1 | * | 11/2007 | Mochizuki ............. B82Y 20/00 372/50.1 |
| 2008/0008219 | A1 | * | 1/2008 | Mochizuki .......... H01S 5/18386 372/44.01 |
| 2008/0310474 | A1 | * | 12/2008 | Huang ...................... H01S 5/10 372/66 |
| 2009/0034905 | A1 | * | 2/2009 | Ty Tan ................... B82Y 20/00 385/14 |
| 2009/0201958 | A1 | | 8/2009 | Albrecht et al. |
| 2010/0315478 | A1 | * | 12/2010 | Choi .......................... B41J 2/45 347/255 |
| 2011/0044362 | A1 | * | 2/2011 | Wada .................... H01S 5/1071 372/45.01 |
| 2011/0080931 | A1 | * | 4/2011 | Tredicucci ............. B82Y 20/00 372/45.012 |
| 2011/0315898 | A1 | | 12/2011 | Capasso et al. |
| 2012/0063478 | A1 | | 3/2012 | Park |
| 2012/0063484 | A1 | * | 3/2012 | Goddard ............ G02B 6/12007 372/94 |
| 2012/0093189 | A1 | | 4/2012 | Fattal et al. |
| 2012/0153260 | A1 | * | 6/2012 | Kim ....................... B82Y 40/00 257/14 |
| 2013/0070799 | A1 | | 3/2013 | Lee et al. |
| 2013/0287056 | A1 | * | 10/2013 | Gerard ................ H01S 3/08018 372/50.1 |
| 2014/0226691 | A1 | * | 8/2014 | Kim ....................... B82Y 20/00 372/45.01 |
| 2014/0328363 | A1 | | 11/2014 | Kwon et al. |
| 2015/0171587 | A1 | * | 6/2015 | Schad ..................... H01S 5/141 372/36 |
| 2016/0056611 | A1 | | 2/2016 | Baik et al. |

FOREIGN PATENT DOCUMENTS

| | | |
|---|---|---|
| KR | 1020040048022 A | 6/2004 |
| KR | 1020060123319 A | 12/2006 |
| KR | 10-2007-0050992 A | 5/2007 |
| KR | 1020080102249 A | 11/2008 |
| KR | 10-2010-0133191 A | 12/2010 |
| KR | 10-2012-0042456 A | 5/2012 |
| KR | 1020120071590 A | 7/2012 |
| KR | 1020120094151 A | 8/2012 |

OTHER PUBLICATIONS

Ding et al., "Record performance of electrical injection sub-wavelength metallic-cavity semiconductor lasers at room temperature", Optics Express, vol. 21, No. 4, Feb. 25, 2013, 6 total pages.
Kwon et al., "Subwavelength Plasmonic Lasing from a Semiconductor Nanodisk with Silver Nanopan Cavity", Nano Letters, 2010, 5 total pages.
Nezhad et al., "Room-temperature subwavelength metallo-dielectric lasers", Nature Photonics, vol. 4, Jun. 2010, 5 total pages.
Park et al., "Electrically Driven Single-Cell Photonic Crystal Laser", Science, vol. 305, Sep. 3, 2004, 4 total pages.
Notomi et al., "Ultrahigh-Q Nanocavity with 1D Photonic Gap", Optics Express, vol. 16, No. 15, Jul. 21, 2008, 8 total pages.
Hill et al., "Lasing in metallic-coated nanocavities", Nature Photonics, vol. 1, Oct. 2007, 6 total pages.
Mandal et al., "Nanomanipulation Using Silicon Photonic Crystal Resonators", Nano Letters, 2010, 6 total pages.
Oulton et al., "Plasmon lasers at deep subwavelength scale", Nature, vol. 461, Oct. 1, 2009, 4 total pages.
Pan et al., "Maskless Plasmonic Lithography at 22 nm Resolution", Scientific Reports, 2011, 6 total pages.
Shambat et al., "Direct ban Ge photoluminescence near 1.6 μm coupled to Ge-on-Si microdisk resonators", Applied Physics Letters 97, 2010, 3 total pages.
Communication dated Apr. 3, 2017 issued by the European Patent Office in counterpart European Patent Application No. 16186465.7.
N.V. Kryzhanovskaya et al.; "Control of Emission Spectra in quantum dot microdisk/microring lasers"; Optics Express; vol. 22; No. 21; 2014; 6 pages total.
Jin Hyoung Lee et al.; "Electrically pumped sub-wavelength metallo-dielectric pedestal pillar lasers"; Optics Express; vol. 19; No. 22; 2011; 8 pages total.
S. A. Backes et al.; "Microdisk laser structures for mode control and directional emission"; Journal of Vacuum Science & Technology B: Microelectronics Processing and Phenomena; American Vacuum Society; vol. 16; No. 6; 1998; 12 pages total.
Svetlana V. Boriskina et al.; "Q-factor and emission pattern control of the WG modes in notched microdisk resonators"; IEEE Journal of Selected Topics in Quantum Electronics; 2005; 8 pages total.

* cited by examiner

SEMICONDUCTOR LASER RESONATOR AND SEMICONDUCTOR LASER DEVICE INCLUDING THE SAME

CROSS-REFERENCE TO RELATED APPLICATION

This application claims the benefit of Korean Patent Application No. 10-2015-0138004, filed on Sep. 30, 2015, in the Korean Intellectual Property Office, the disclosure of which is incorporated herein in its entirety by reference.

BACKGROUND

1. Field

Apparatuses and methods consistent with exemplary embodiments relate to a semiconductor laser, and more particularly, to a semiconductor laser resonator capable of selecting or separating a resonant mode from other resonant modes and a semiconductor laser device including the same.

2. Description of the Related Art

In semiconductor laser devices, a semiconductor laser resonator is a core part for obtaining an optical gain. In general, a gain medium of a semiconductor laser resonator has a circular disc shape or a cubic shape. The gain medium and its vicinity are covered with a metal or a dielectric material. However, the number of resonant modes generated by the semiconductor laser resonator is high and the resonant modes are complicated.

SUMMARY

Provided are a semiconductor laser resonator capable of selecting or separating a resonant mode from other resonant modes and a semiconductor laser device including the same.

Additional aspects will be set forth in part in the description which follows and, in part, will be apparent from the description, or may be learned by practice of the exemplary embodiments.

According to an aspect of an exemplary embodiment, there is provided a semiconductor laser resonator configured to generate a laser beam, the semiconductor laser resonator including: a gain medium layer including a semiconductor material and including at least one protrusion formed by at least one trench to protrude in an upper portion of the gain medium layer, in which the at least one protrusion is configured to confine the laser beam as a standing wave in the at least one protrusion.

The semiconductor laser resonator may further include a metal layer provided outside the gain medium layer, the metal layer being configured to confine the laser beam generated from the gain medium layer.

The semiconductor laser resonator may further include a buffer layer provided between the gain medium layer and the metal layer, the buffer layer being configured to buffer an optical loss of the laser beam generated from the gain medium layer.

The semiconductor laser resonator may further include a dielectric layer provided outside the gain medium layer, the dielectric layer being configured to confine the laser beam generated from the gain medium layer and having a refractive index different from a refractive index of the gain medium layer.

A lower portion of the gain medium layer is configured to further confine the laser beam therein.

The gain medium layer may be cylindrical shaped or rectangular shaped.

The trench may have at least one planar shape selected from a line shape, a circular shape, a polygonal shape, and a ring shape.

The at least one protrusion may include at least one first protrusion arranged along an outer edge of the gain medium layer.

The at least one protrusion may further include at least one second protrusion arranged inwardly from the at least one first protrusion.

The gain medium layer may include an active layer.

The active layer may include at least one of a group III-V semiconductor material, a group II-VI semiconductor material, and quantum dots.

The gain medium layer may further include a first clad layer disposed on a first surface of the active layer and a second clad layer disposed on a second surface of the active layer.

The semiconductor laser resonator may further include a first contact layer disposed on a first surface of the gain medium layer, and a second contact layer disposed on a second surface of the gain medium layer.

The first contact layer may correspond to the at least one protrusion.

The first contact layer and the second contact layer have a shape corresponding to a shape of the gain medium layer.

According to an aspect of another exemplary embodiment, there is provided a semiconductor laser device, the semiconductor laser device including: a substrate, and a semiconductor laser resonator provided on the substrate and configured to generate a laser beam by absorbing energy, in which the semiconductor laser resonator may include a gain medium layer including a semiconductor material and including at least one protrusion formed by at least one trench to protrude in an upper portion of the gain medium layer, and the at least one protrusion is configured to confine the laser beam as a standing wave in the at least one protrusion.

The semiconductor laser resonator may further include a metal layer provided outside the gain medium layer, the metal layer being configured to confine the laser beam generated from the gain medium layer.

The semiconductor laser resonator may further include a buffer layer provided between the gain medium layer and the metal layer, the buffer layer being configured to buffer an optical loss of the laser beam generated from the gain medium layer.

The semiconductor laser resonator may further include a dielectric layer provided outside the gain medium layer, the dielectric layer being configured to confine the laser beam generated from the gain medium layer and having a refractive index different from a refractive index of the gain medium layer.

The trench may have at least one planar shape selected from a line shape, a circular shape, a polygonal shape, and a ring shape.

The at least one protrusion may include at least one first protrusion arranged along an outer edge of the gain medium layer.

The at least one protrusion may further include at least one second protrusion arranged inwardly from the at least one first protrusion.

The gain medium layer may include an active layer.

The active layer may include at least one of a group III-V semiconductor material, a group II-VI semiconductor material, and quantum dots.

The gain medium layer may further include a first clad layer disposed on a first surface of the active layer and a second clad layer disposed on a second surface of the active layer.

The semiconductor laser device may further include a first contact layer disposed on a first surface of the gain medium layer, and a second contact layer disposed on a second surface of the gain medium layer.

The first contact layer and the second contact layer have a shape corresponding to a shape of the gain medium layer.

The semiconductor laser device may further include a plurality of electrodes electrically connected to the first contact layer and the second contact layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the exemplary embodiments, taken in conjunction with the accompanying drawings in which.

DETAILED DESCRIPTION OF EXEMPLARY EMBODIMENTS

Figure 1:
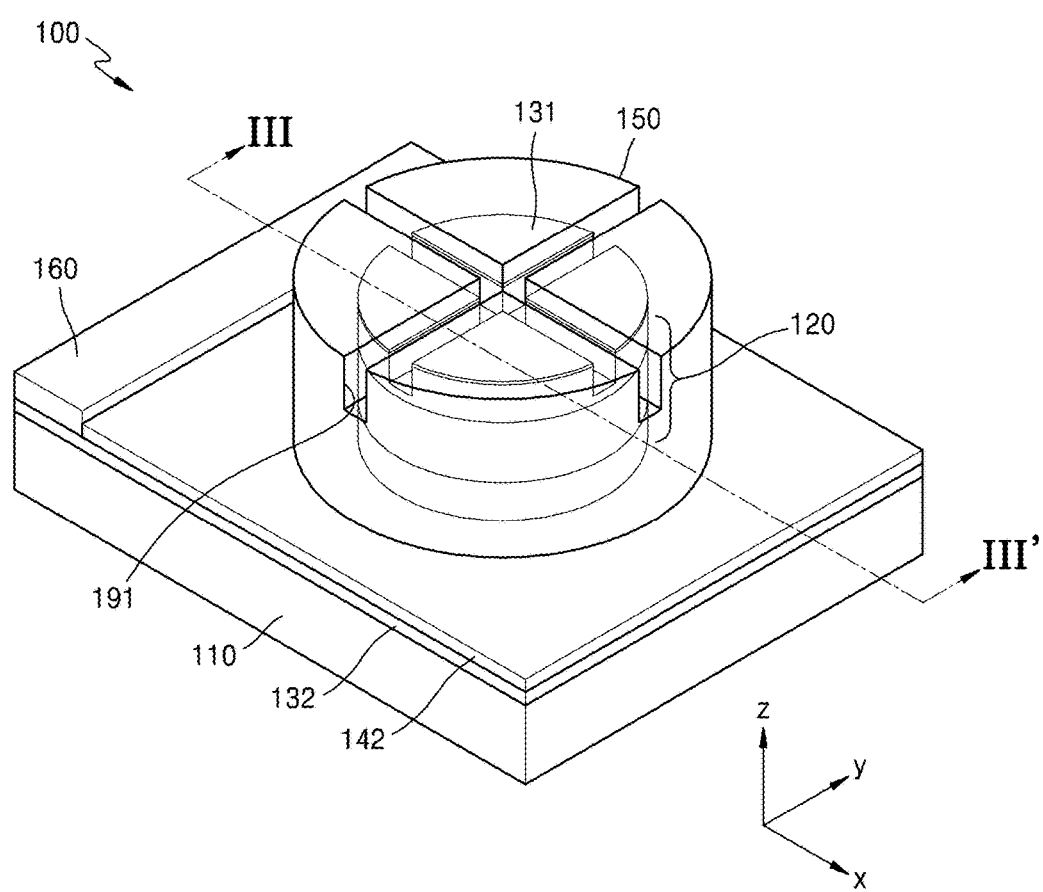
FIG. 1 is a perspective view of a semiconductor laser device according to an exemplary embodiment.

Reference will now be made in detail to exemplary embodiments, examples of which are illustrated in the accompanying drawings, wherein like reference numerals refer to like elements throughout and thicknesses or size of elements may be exaggerated for convenience of explanation and clarity. In this regard, the exemplary embodiments may have different forms and should not be construed as being limited to the descriptions set forth herein. Accordingly, the exemplary embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner. Also, well-known functions or constructions are not described in detail since they would obscure the exemplary embodiments with unnecessary detail.

Figure 2:
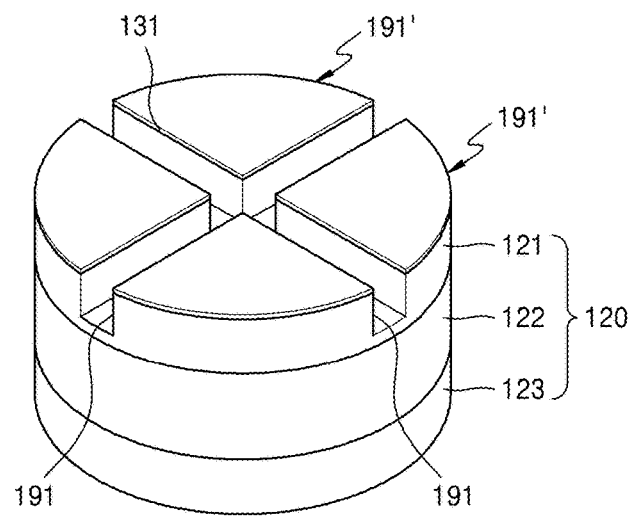
FIG. 2 is a perspective view of a gain medium layer of FIG. 1.
Figure 3:
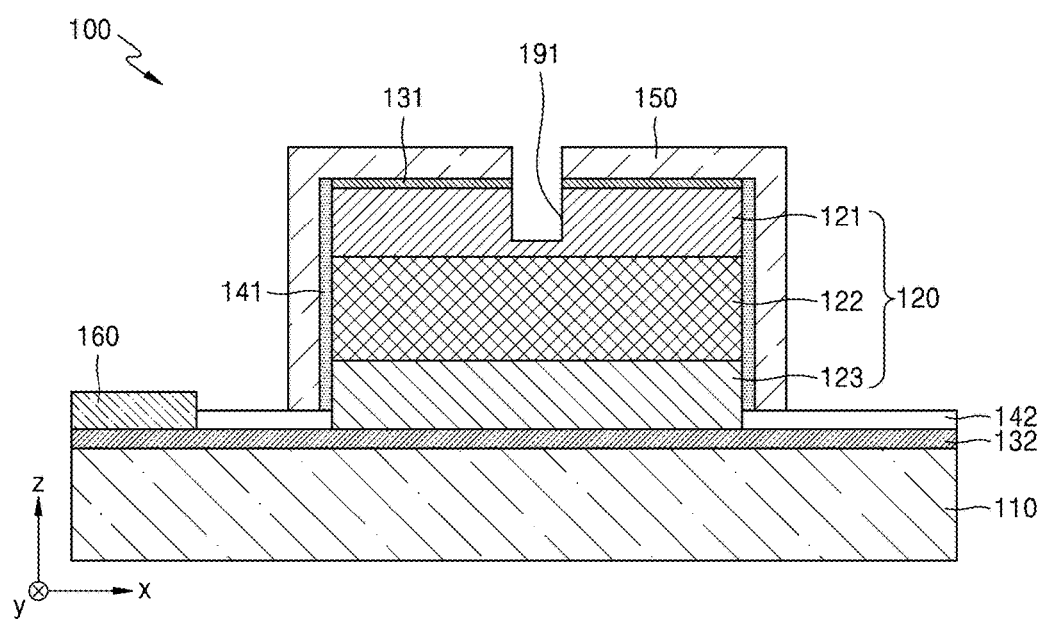
FIG. 3 is a cross-sectional view taken along line III-III' of FIG. 1.

FIG. 1 is a perspective view of a semiconductor laser device 100 according to an exemplary embodiment. FIG. 2 is a perspective view of a gain medium layer of FIG. 1. FIG. 3 is a cross-sectional view taken along line III-III' of FIG. 1.

Referring to FIGS. 1 to 3, the semiconductor laser device 100 may include a substrate 110 and a semiconductor laser resonator provided on the substrate 110. The substrate 110 may be a semiconductor substrate, but is not limited thereto, and may be formed of various materials, such as glass. In detail, the substrate 110 may be an indium phosphide (InP) substrate or a gallium arsenide (GaAs) substrate, but is not limited thereto.

The semiconductor laser resonator may generate a laser beam by absorbing energy from the outside. The semiconductor laser resonator may have, for example, a nano-size or a micro-size, but is not limited thereto. The semiconductor laser resonator may include a gain medium layer 120 for generating a laser beam by absorbing energy via optical pumping or electric pumping. The gain medium layer 120 may include an active layer 122 including a semiconductor material. The active layer 122 may include, for example, a group III-V semiconductor material or a group II-VI semiconductor material. Also, the active layer 122 may include quantum dot. In detail, the active layer 122 may include a plurality of multi-quantum walls including indium gallium arsenide (InGaAs), aluminum gallium arsenide (AlGaAs), indium gallium arsenide phosphide (InGaAsP), or aluminum gallium indium phosphide (AlGaInP), but is not limited thereto.

The gain medium layer 120 may further include first and second clad layers 121 and 123 respectively provided above and under the active layer 122. The first clad layer 121 is disposed on a first surface of the active layer 122, that is, an upper surface of the active layer 122 in FIG. 3, and may include an n-type or p-type semiconductor material. In detail, the first clad layer 121 may include n-type InP or p-type InP, but is not limited thereto. The second clad layer 123 may be disposed on a second surface of the active layer 122, that is, a lower surface of the active layer 122 in FIG. 3. If the first clad layer 121 includes an n-type semiconductor material, the second clad layer 123 may include a p-type semiconductor material. Alternatively, if the first clad layer 121 includes a p-type semiconductor material, the second clad layer 123 may include an n-type semiconductor material. In detail, the second clad layer 123 may include a p-type InP or an n-type InP, but is not limited thereto.

The gain medium layer 120 may have, for example, a cylindrical shape, but is not limited thereto, and the gain medium layer 120 may have a cubic shape or other various shapes. In the exemplary embodiment, at least one trench 191 is formed in an upper portion of the gain medium layer 120 to a certain depth. At least one protrusion 191' may be defined by the trench 191 in the upper portion of the gain medium layer 120.

In detail, referring to FIG. 2, two trenches 191 are formed in the upper portion of the gain medium layer 120 to a certain depth. The trenches 191 may have a line shape and intersect with each other. The trenches 191 may be formed to various depths from an upper surface of the gain medium layer 120. FIG. 3 illustrates an example in which the trenches 191 are formed in the first clad layer 121, but is not limited thereto, and the trenches 191 may be formed in the first clad layer 121 and the active layer 122 or in the first clad layer 121, the active layer 122, and the second clad layer 123. Four protrusions 191' may be formed in the upper portion of the gain medium layer 120 by the trenches 191 intersecting as above. The protrusions 191' may be cyclically arranged along an outer edge of the gain medium layer 120.

As such, since the protrusions 191' formed in the upper portion of the gain medium layer 120 by the trenches 191 are cyclically arranged, a laser beam generated from the gain medium layer 120 may be confined as a standing wave in at least one of the protrusions 191'. The confinement of a laser beam as a standing wave in the protrusions 191' refers to a feature by which the intensity of the laser beam may be changed according to time, but the laser beam is confined at a certain position in the protrusions 191'. The laser beam confined in the protrusions 191' may have intensity that decreases toward surfaces of the protrusions 191'. The laser beam generated from the gain medium layer 120 may be confined not only in the protrusions 191' provided in the upper portion of the gain medium layer 120, but also in a lower portion of the gain medium layer 120.

As such, since the laser beam generated from the gain medium layer 120 is confined as a standing wave in the at least one of the protrusions 191', a resonant mode of a desired wavelength may be easily selected as described below. Also, undesired resonant modes may be removed or a desired resonant mode may be effectively separated from other resonant modes. Accordingly, a Q-factor of a semiconductor laser resonator may be improved. A resonant mode may be selected and/or separated based on at least one of the number, shape, and size of the protrusions 191' defined by the trenches 191 and the interval between the protrusions 191'. Also, by providing a metal layer 150 outside the gain medium layer 120, a laser beam generated from the gain medium layer 120 may be efficiently confined.

A first contact layer 131 may be disposed on the upper surface of the gain medium layer 120. For example, the first contact layer 131 may be disposed on the upper surface of the first clad layer 121. The first contact layer 131 may have a shape corresponding to the upper surface of the gain medium layer 120. Accordingly, the trenches 191 formed in the upper portion of the gain medium layer 120 may extend to the first contact layer 131. If the first clad layer 121 includes an n-type semiconductor material, the first contact layer 131 may include an n-type semiconductor material. If the first clad layer 121 includes a p-type semiconductor material, the first contact layer 131 may include a p-type semiconductor material. In detail, the first contact layer 131 may include an n-type InGaAs or a p-type InGaAs, but is not limited thereto. An electrode (not shown) electrically connected to the first contact layer 131 may be further provided.

A second contact layer 132 may be disposed on a lower surface of the second clad layer 123. The second contact layer 132 may be disposed on an upper surface of the substrate 110. If the second clad layer 123 includes a p-type semiconductor material, the second contact layer 132 may include a p-type semiconductor material. If the second clad layer 123 includes an n-type semiconductor material, the second contact layer 132 may include an n-type semiconductor material. In detail, the second contact layer 132 may include a p-type InGaAs or an n-type InGaAs, but is not limited thereto. An electrode 160 that is electrically connected to the second contact layer 132 may be further provided on the substrate 110. If the second contact layer 132 includes a p-type semiconductor material, the electrode 160 may be a p-type electrode. If the second contact layer 132 includes an n-type semiconductor material, the electrode 160 may be an n-type electrode.

A metal layer 150 may be further provided to cover the gain medium layer 120 and the first contact layer 131. The metal layer 150 located above the first contact layer 131 may have a shape corresponding to the first contact layer 131. Accordingly, the trenches 191 formed in the upper portion of the gain medium layer 120 may extend to the metal layer 150 located above the first contact layer 131. The metal layer 150 provided outside the gain medium layer 120 may confine the laser beam generated from the gain medium layer 120 to the inside of the gain medium layer 120. The metal layer 150 may include, for example, silver (Ag), gold (Au), copper (Cu), or aluminum (Al), but is not limited thereto and other various metal materials may be included. The laser beam generated from the gain medium layer 120 may be efficiently confined by the metal layer 150.

A buffer layer 141 may be further provided between the metal layer 150 and the gain medium layer 120. For example, the buffer layer 141 may be provided between a side surface of the gain medium layer 120 and the metal layer 150. The buffer layer 141 may buffer an optical loss when the laser beam generated from the gain medium layer 120 contacts the metal layer 150. The buffer layer 141 may include a material having a refractive index that is different from that of the gain medium layer 120. In detail, the buffer layer 141 may include a material having a refractive index that is smaller than that of the gain medium layer 120. For example, the buffer layer 141 may include a silicon oxide or a silicon nitride, but is not limited thereto. An insulation layer 142 may be further formed on the substrate 110 to cover an exposed upper surface of the second contact layer 132.

As described above, in the semiconductor laser device 100 according to an exemplary embodiment, since the trenches 191 are formed in the upper portion of the semiconductor laser resonator and the protrusions 191' are defined by the trenches 191, the laser beam generated from the gain medium layer 120 may be confined as a standing wave in the at least one of the protrusions 191'. As such, if the laser beam generated from the gain medium layer 120 is confined as a standing wave in the at least one of the protrusions 191' provided in the upper portion of the gain medium layer 120, a resonant mode of a desired wavelength may be easily selected. Also, undesired resonant modes may be removed or a desired resonant mode may be effectively separated from other resonant modes. Accordingly, a Q-factor of the semiconductor laser resonator may be improved. Also, if the metal layer 150 is provided outside the gain medium layer 120, the laser beam generated from the gain medium layer 120 may be efficiently confined.

Figure 4:
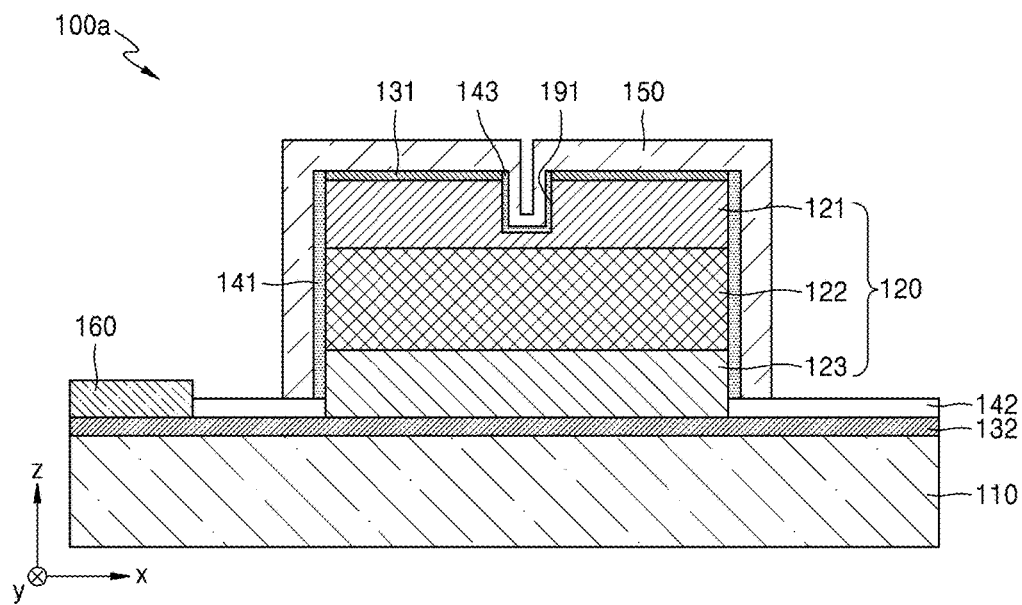
FIG. 4 is a cross-sectional view of a semiconductor laser device according to another exemplary embodiment.

FIG. 4 is a cross-sectional view of a semiconductor laser device 100a according to another exemplary embodiment. The semiconductor laser device 100a of FIG. 4 is similar to the semiconductor laser device 100 of FIGS. 1 to 3, except that a dielectric material 143 is formed on an inner wall of the trenches 191 formed in the upper portion of the gain medium layer 120.

Referring to FIG. 4, the semiconductor laser device 100a may include the substrate 110 and a semiconductor laser resonator provided on the substrate 110 and generating a laser beam by absorbing energy from the outside. The semiconductor laser resonator may include the gain medium layer 120 and the trenches 191 are formed in the upper portion of the gain medium layer 120. The dielectric material 143 may be formed on the inner wall of the trenches 191 formed in the upper portion of the gain medium layer 120. The dielectric material 143 may include, for example, the same material as the material forming the buffer layer 141. Accordingly, the metal layer 150 may cover the gain medium layer 120, the first contact layer 131, and the dielectric material 143.

Figure 5:
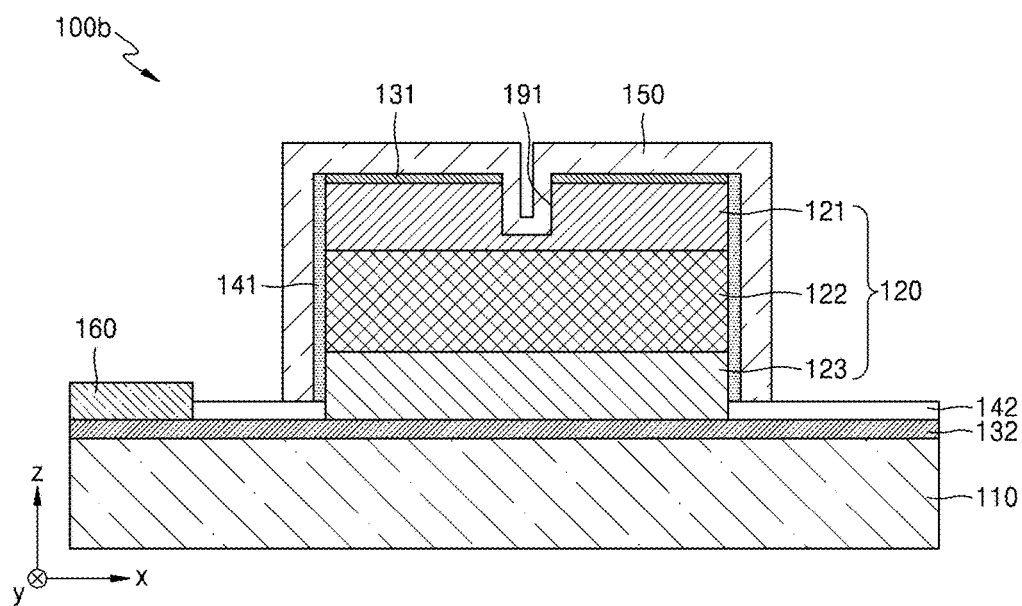
FIG. 5 is a cross-sectional view of a semiconductor laser device according to another exemplary embodiment.

FIG. 5 is a cross-sectional view of a semiconductor laser device 100b according to another exemplary embodiment. The semiconductor laser device 100b of FIG. 5 is similar to the semiconductor laser device 100 of FIGS. 1 to 3, except that the trenches 191 formed in the upper portion of the gain medium layer 120 is filled with the metal layer 150.

Referring to FIG. 5, the semiconductor laser device 100b may include the substrate 110 and a semiconductor laser resonator provided on the substrate 110 and generating a laser beam by absorbing energy from the outside. The semiconductor laser resonator may include the gain medium layer 120 and the trenches 191 are formed in the upper portion of the gain medium layer 120. The metal layer 150 may cover the gain medium layer 120 and the first contact layer 131. In this case, the trenches 191 formed in the upper portion of the gain medium layer 120 may be filled with the metal layer 150.

Figure 6:
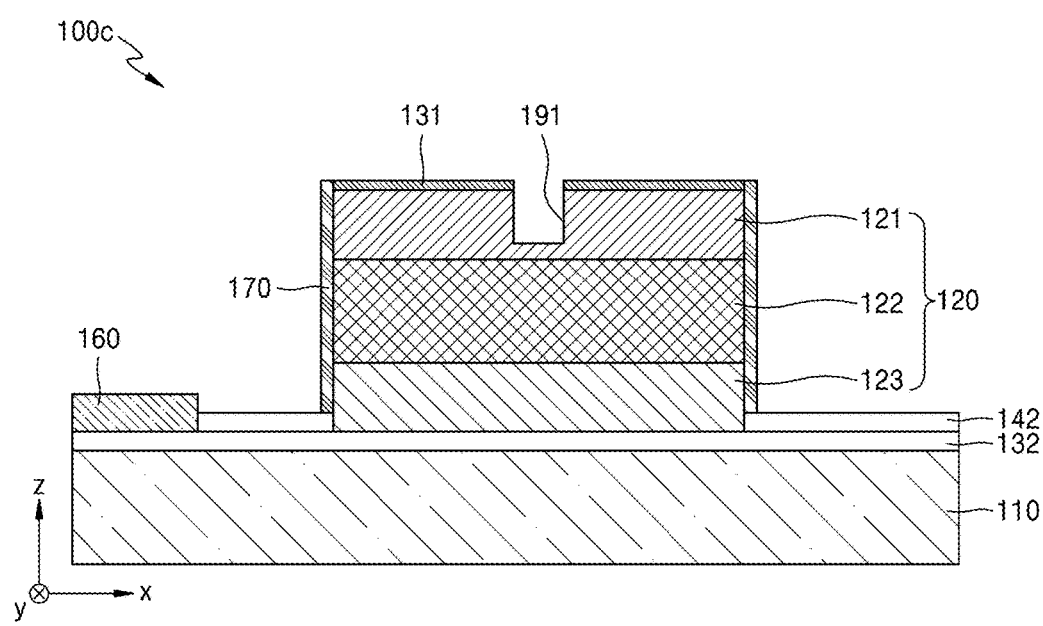
FIG. 6 is a cross-sectional view of a semiconductor laser device according to another exemplary embodiment.

FIG. 6 is a cross-sectional view of a semiconductor laser device 100c according to another exemplary embodiment.

Referring to FIG. 6, the semiconductor laser device 100c may include the substrate 110 and a semiconductor laser resonator provided on the substrate 110 and generating a laser beam by absorbing energy from the outside. The semiconductor laser resonator may include the gain medium layer 120 and the trenches 191 are formed in the upper portion of the gain medium layer 120.

The first contact layer 131 is provided to cover the upper surface of the gain medium layer 120. A dielectric layer 170 is provided to cover the side surface of the gain medium layer 120. The dielectric layer 170 confines the laser beam generated from the gain medium layer 120. To this end, the dielectric layer 170 may include a material having a refractive index that is different from that of the gain medium layer 120. In detail, the dielectric layer 170 may include a material having a refractive index that is smaller than that of the gain medium layer 120. The dielectric layer 170 may include, for example, a silicon oxide or a silicon nitride, but is not limited thereto.

Although in the above exemplary embodiments, two trenches 191 are formed in the upper portion of the gain medium layer 120, the number or shape of the trenches 191 formed in the gain medium layer 120 may be variously changed.

Figure 7A:
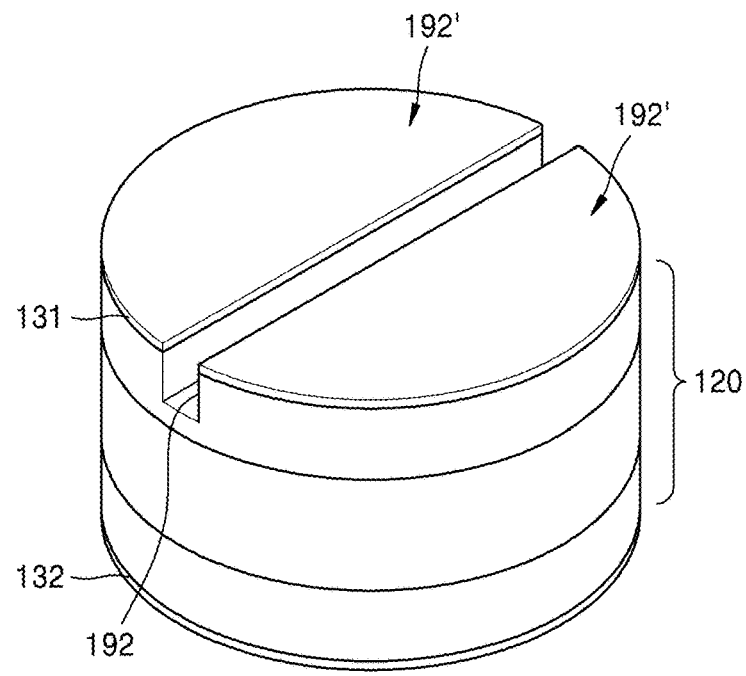
FIGS. 7A and 7B are perspective views of semiconductor laser resonators according to another exemplary embodiment.
Figure 7B:
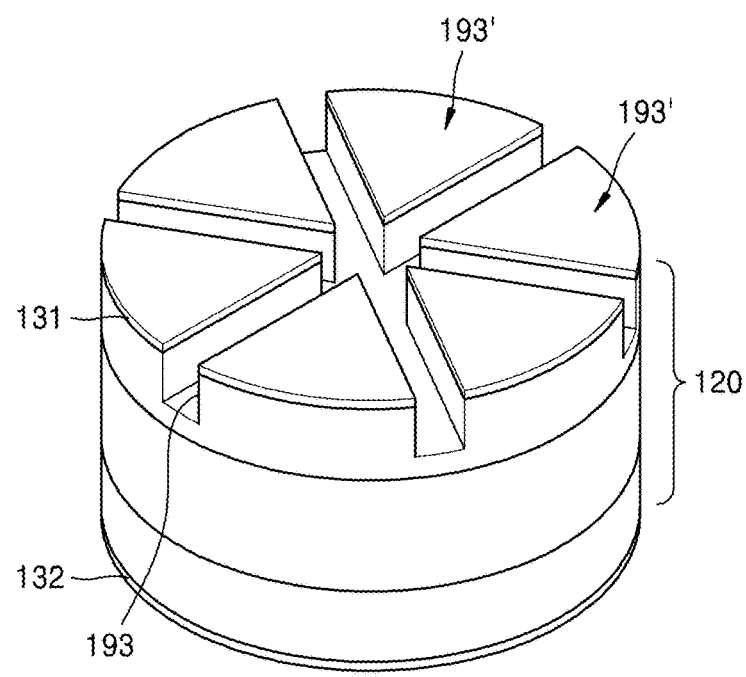

FIGS. 7A and 7B are perspective views of semiconductor laser resonators according to another exemplary embodiment.

In the semiconductor laser resonator of FIG. 7A, the gain medium layer 120 has a cylindrical shape, and one line-shaped trench 192 is formed in the upper portion of the gain medium layer 120 to a certain depth. Accordingly, two protrusions 192' may be defined by the one line-shaped trench 192 in the upper portion of the gain medium layer 120. The first contact layer 131 may be disposed on the upper surface of the gain medium layer 120, that is, on an upper surface of each of the protrusions 192', and the second contact layer 132 may be disposed on a lower surface of the gain medium layer 120.

In the semiconductor laser resonator of FIG. 7B, three line-shaped trenches 193 are formed in the upper portion of the gain medium layer 120 having a cylindrical shape to intersect with one another. Six protrusions 193' may be defined by the three line-shaped trenches 193 in the upper portion of the gain medium layer 120.

Figure 8A:
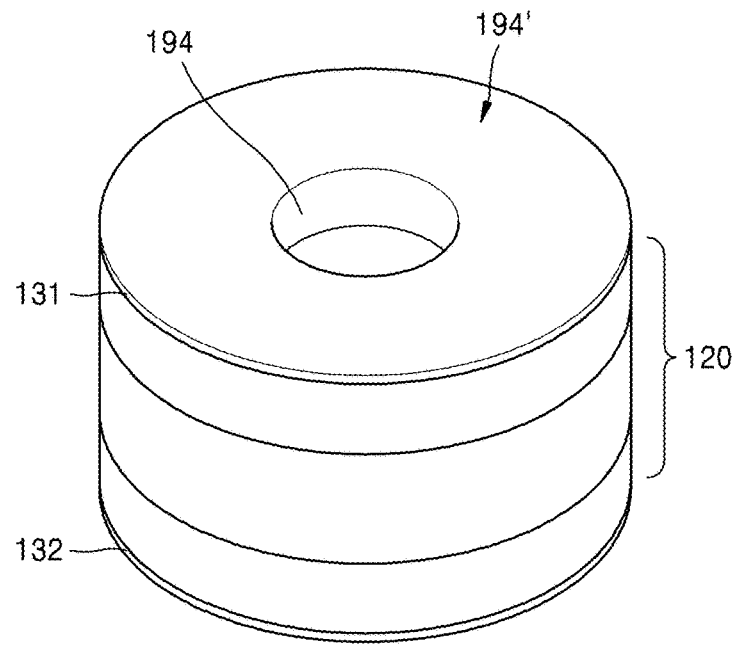
FIGS. 8A and 8B are perspective views of semiconductor laser resonators according to another exemplary embodiment.
Figure 8B:
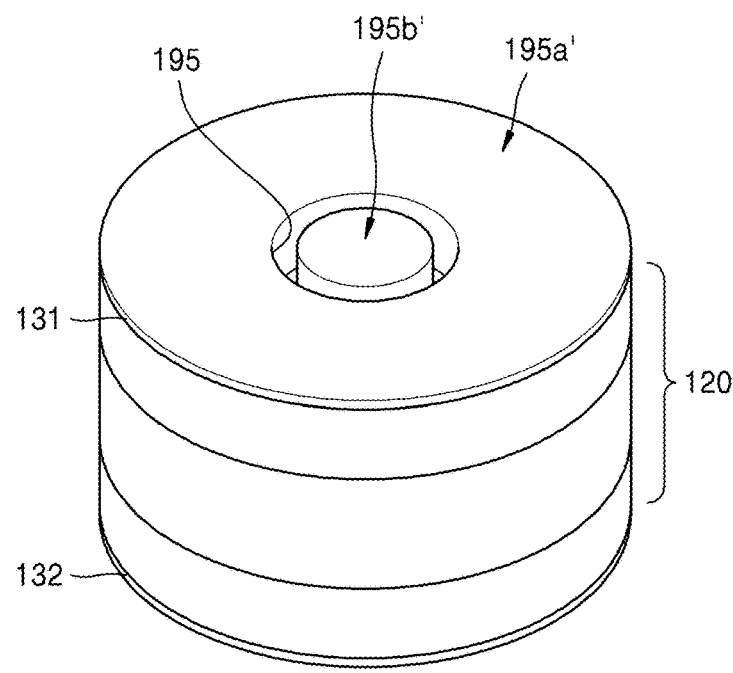

FIGS. 8A and 8B are perspective views of semiconductor laser resonators according to another exemplary embodiment.

In the semiconductor laser resonator of FIG. 8A, a circular trench 194 is formed to a certain depth in the upper portion of the gain medium layer 120 having a cylindrical shape. The circular trench 194 may be located at a center portion of the gain medium layer 120. A protrusion 194' surrounding the circular trench 194 may be defined by the circular trench 194 in the upper portion of the gain medium layer 120.

In the semiconductor laser resonator of FIG. 8B, a ring-shaped trench 195 is formed to a certain depth in the upper portion of the gain medium layer 120 having a circular shape. In this case, the ring-shaped trench 195 may be located at the center portion of the gain medium layer 120. A first protrusion 195a' disposed outwardly from the ring-shaped trench 195 and a second protrusion 195b' disposed inwardly from the ring-shaped trench 195 may be defined by the ring-shaped trench 195 in the upper portion of the gain medium layer 120.

Figure 9A:
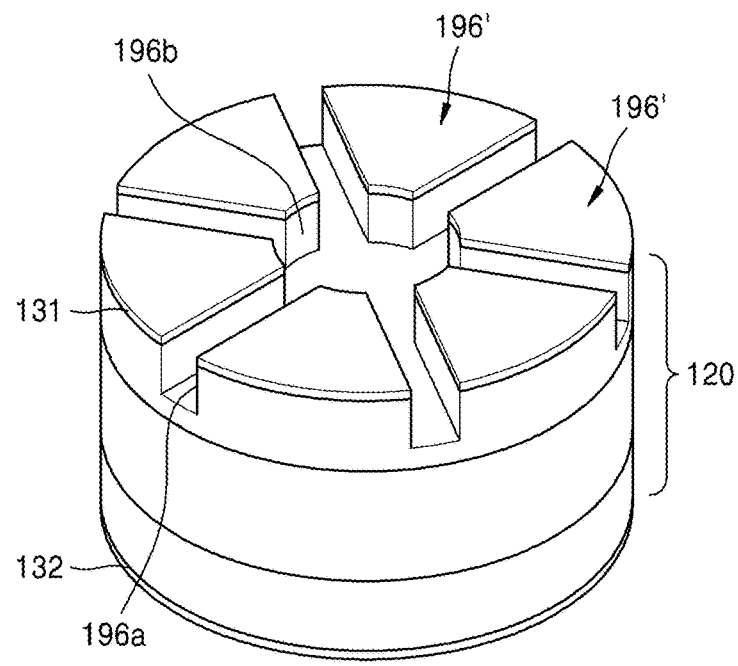
FIGS. 9A and 9B are perspective views of semiconductor laser resonators according to another exemplary embodiment.
Figure 9B:
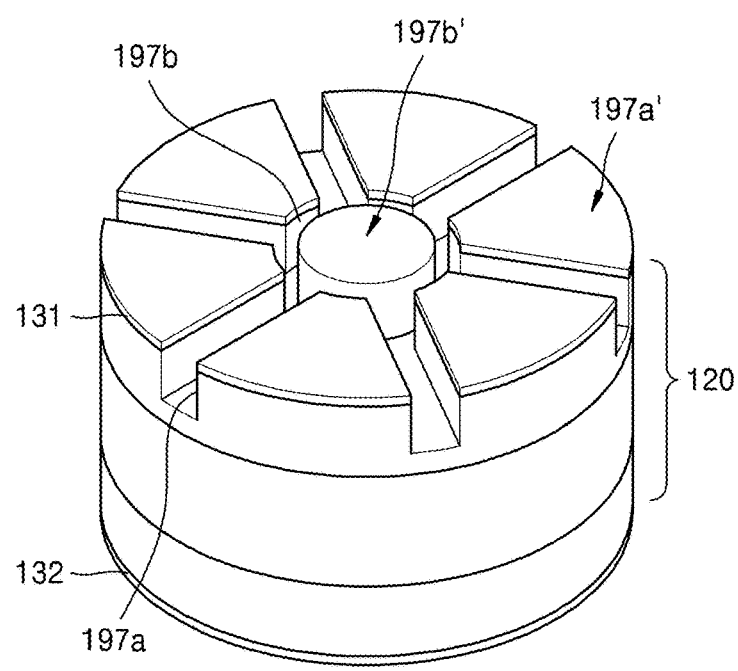

FIGS. 9A and 9B are perspective views of semiconductor laser resonators according to another exemplary embodiment.

In the semiconductor laser resonator of FIG. 9A, line-shaped trenches 196a and a circular trench 196b are formed to a certain depth in the upper portion of the gain medium layer 120 having a cylindrical shape. In this case, the circular trench 196b may be located at the center portion of the gain medium layer 120, and the line-shaped trenches 196a may be connected to the circular trench 196b. A plurality of protrusions 196' cyclically arranged along an outer edge of the gain medium layer 120 may be defined by the line-shaped trenches 196a and the circular trench 196b in the upper portion of the gain medium layer 120. Although FIG. 9A illustrates an example in which the line-shaped trenches 196a are formed, one line-shaped trench 196a may be formed.

In the semiconductor laser resonator of FIG. 9B, line-shaped trenches 197a and a ring-shaped trench 197b are formed to a certain depth in the upper portion of the gain medium layer 120 having a cylindrical shape. In this case, the ring-shaped trench 197b may be located at the center portion of the gain medium layer 120, and the line-shaped trenches 197a may be connected to the ring-shaped trench 197b. A plurality of first protrusions 197a' cyclically arranged along an outer edge of the gain medium layer 120 and a second protrusion 197b' provided at the center portion of the gain medium layer 120 may be defined by the line-shaped trenches 197a and the ring-shaped trench 197b in the upper portion of the gain medium layer 120. Although FIG. 9B illustrates an example in which the line-shaped trenches 197a are formed, one line-shaped trench 197a may be formed.

Although in the above-described exemplary embodiments a case in which the gain medium layer 120 has a cylindrical shape is described, the shape of the gain medium layer 120 may be variously changed.

Figure 10A:
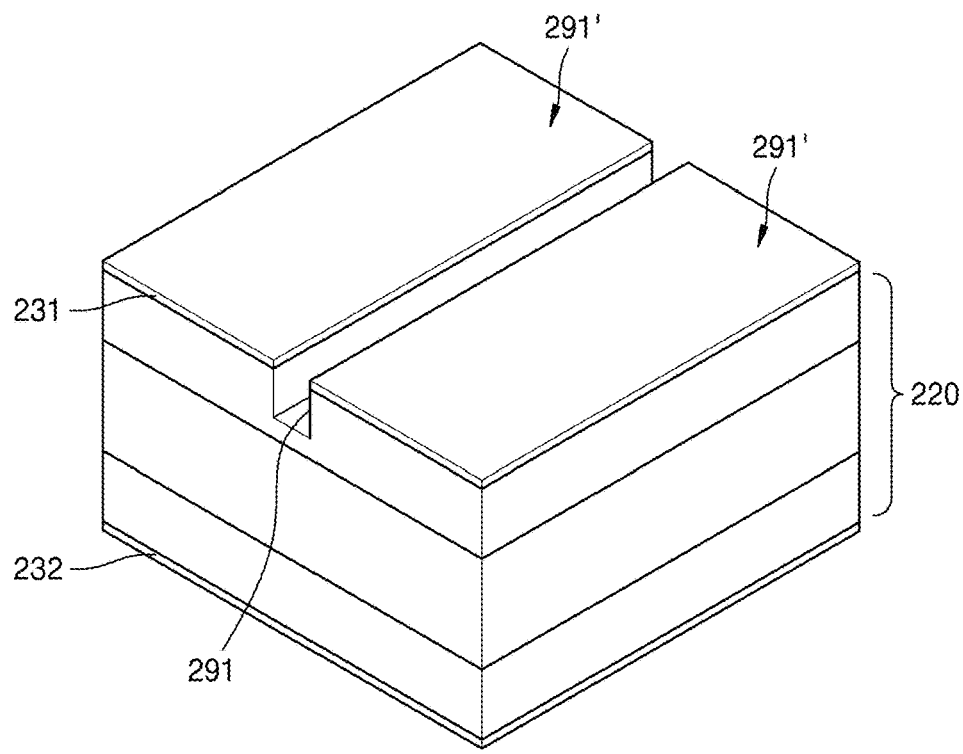
FIGS. 10A, 10B, and 10C are perspective views of semiconductor laser resonators according to another exemplary embodiment.
Figure 10B:
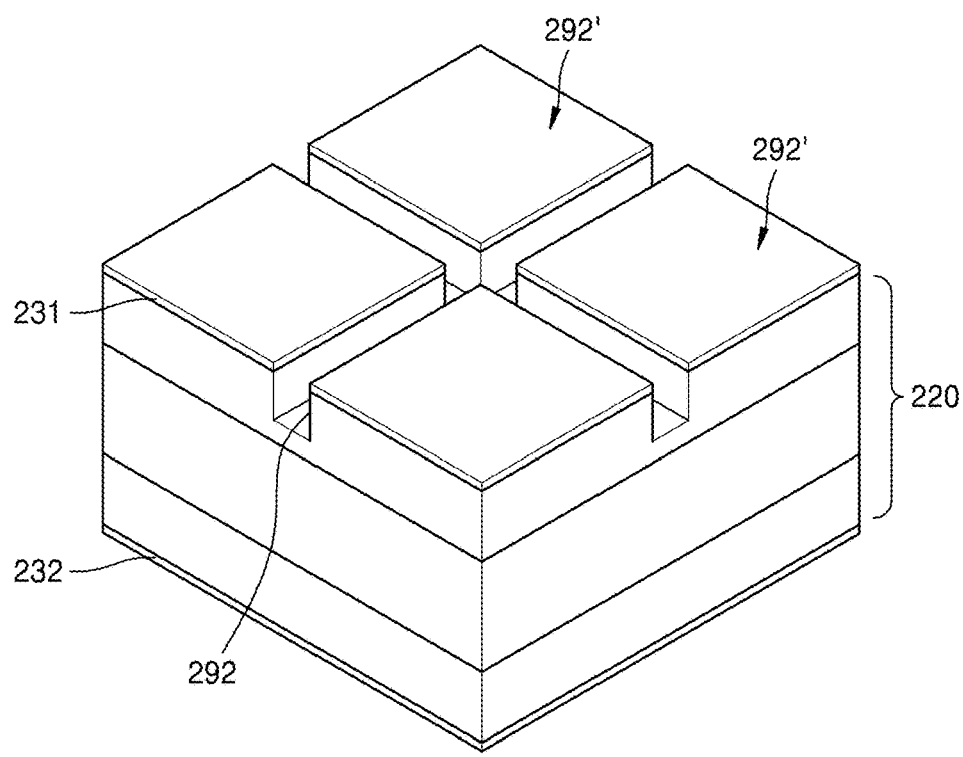
Figure 10C:
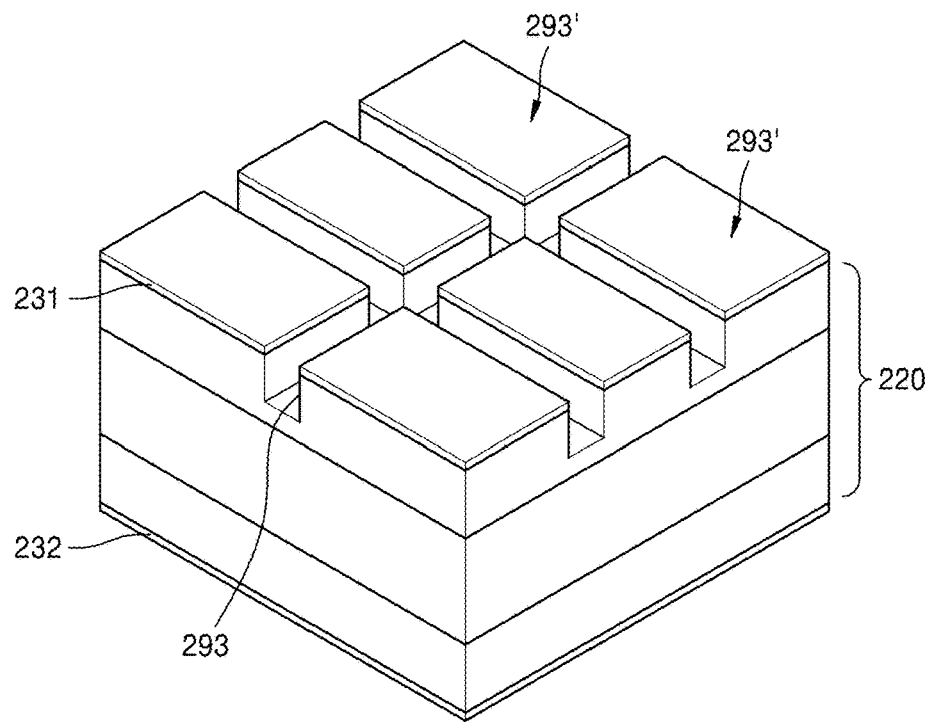

FIGS. 10A to 10C are perspective views of semiconductor laser resonators according to another exemplary embodiment.

In the semiconductor laser resonator of FIG. 10A, a gain medium layer 220 has a cubic shape. One line-shaped trench 291 is formed to a certain depth in the upper portion of the gain medium layer 220. Two protrusions 291' may be defined by the one line-shaped trench 291 in the upper portion of the gain medium layer 220. A first contact layer 231 may be disposed on an upper surface of the gain medium layer 220, that is, on upper surfaces of the protrusions 291', and a second contact layer 232 may be disposed on a lower surface of the gain medium layer 220.

In the semiconductor laser resonator of FIG. 10B, two line-shaped trenches 292 intersecting with each other are formed to a certain depth in the upper portion of the gain medium layer 220 having a cubic shape. Four protrusions 292' may be defined by the four line-shaped trenches 292 in the upper portion of the gain medium layer 220.

In the semiconductor laser resonator of FIG. 10C, three line-shaped trenches 293 are formed to a certain depth in the upper portion of the gain medium layer 220 having a cubic shape. In this case, two line-shaped trenches 293 may be formed parallel to each other, and one line-shaped trench 293 may be formed to intersect with the two line-shaped trenches 293. Six protrusions 293' may be defined by the three line-shaped trenches 293 in the upper portion of the gain medium layer 220.

Figure 11A:
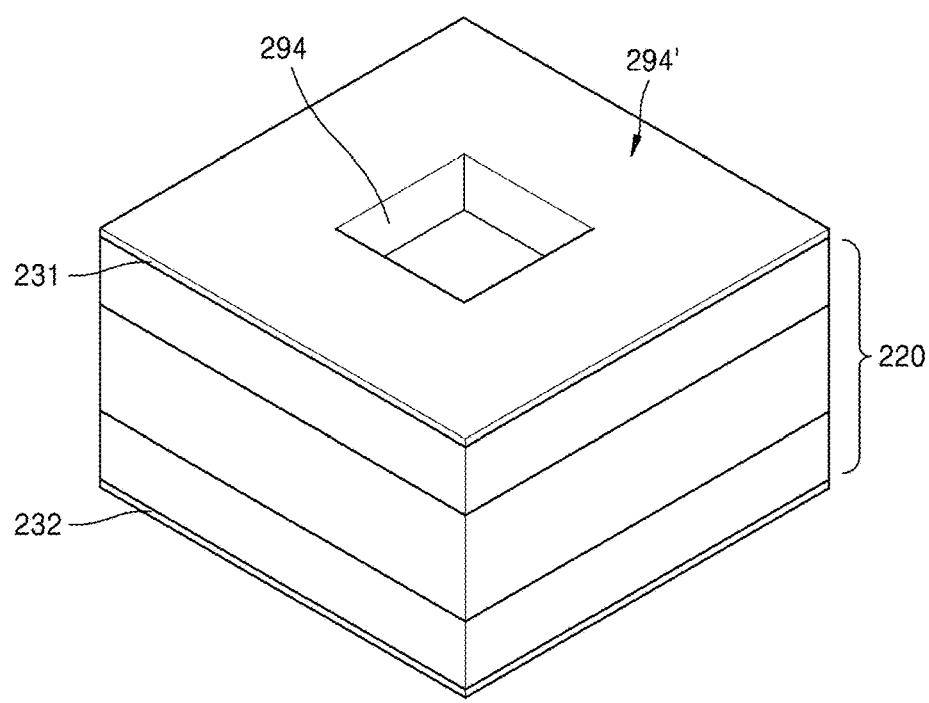
FIGS. 11A and 11B are perspective views of semiconductor laser resonators according to exemplary embodiment.
Figure 11B:
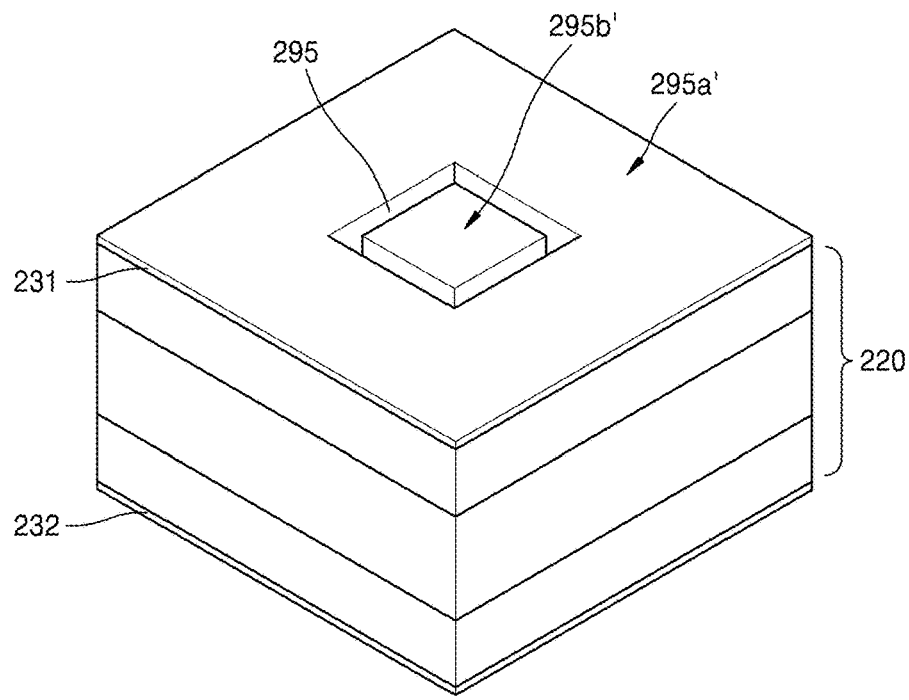

FIGS. 11A and 11B are perspective views of semiconductor laser resonators according to another exemplary embodiment.

In the semiconductor laser resonator of FIG. 11A, a rectangular trench 294 is formed to a certain depth in the upper portion of the gain medium layer 220 having a cubic shape. In this case, the rectangular trench 294 may be located at the center portion of the gain medium layer 220, and a protrusion 294' surrounding the rectangular trench 294 may be defined in the upper portion of the gain medium layer 220.

In the semiconductor laser resonator of FIG. 11B, a rectangular ring-shaped trench 295 may be formed to a certain depth in the upper portion of the gain medium layer 220 having a cubic shape. In this case, the rectangular ring-shaped trench 295 may be located at the center portion of the gain medium layer 220. Accordingly, a first protrusion 295a' disposed outwardly from the rectangular ring-shaped trench 295 and a second protrusion 295b' disposed inwardly from the rectangular ring-shaped trench 295 may be defined in the upper portion of the gain medium layer 220.

Figure 12A:
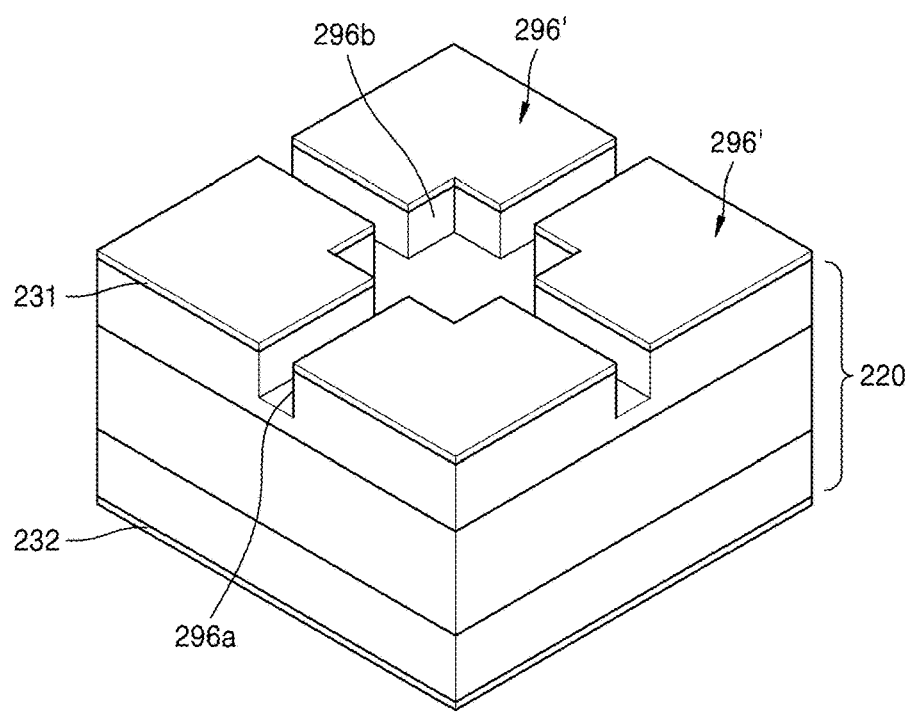
FIGS. 12A and 12B are perspective views of semiconductor laser resonators according to exemplary embodiment.
Figure 12B:
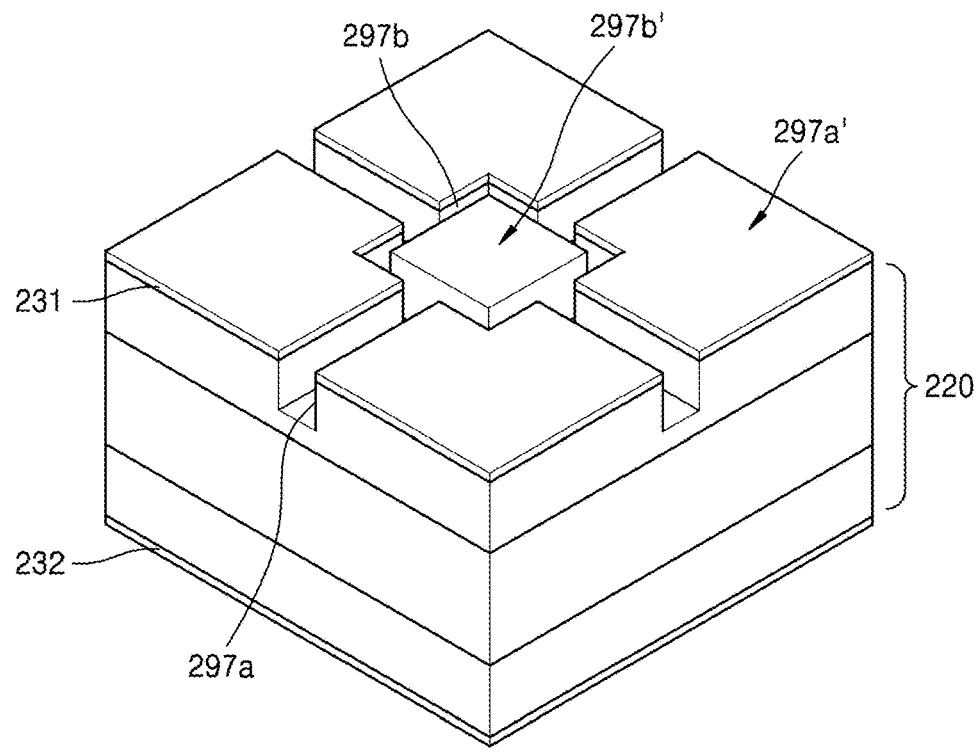

FIGS. 12A and 12B are perspective views of semiconductor laser resonators according to another exemplary embodiment.

In the semiconductor laser resonator of FIG. 12A, line-shaped trenches 296a and a rectangular trench 296b are formed to a certain depth in the upper portion of the gain medium layer 220 having a cubic shape. In this case, the rectangular trench 296b may be located at the center portion of the gain medium layer 220, and the line-shaped trenches 296a may be connected to the rectangular trench 296b. A plurality of protrusions 296' cyclically arranged along an outer edge of the gain medium layer 220 may be defined by the line-shaped trenches 296a and the rectangular trench 296b in the upper portion of the gain medium layer 220. Although FIG. 12A illustrates an example in which the line-shaped trenches 296a are formed, one line-shaped trench 296a may be formed.

In the semiconductor laser resonator of FIG. 12B, line-shaped trenches 297a and a rectangular ring-shaped trench 297b are formed to a certain depth in the upper portion of the gain medium layer 220 having a cubic shape. In this case, the rectangular ring-shaped trench 297b may be located at the center portion of the gain medium layer 220. The line-shaped trenches 297a may be connected to the rectangular ring-shaped trench 297b. Accordingly, a plurality of first protrusions 297a' cyclically arranged along an outer edge of the gain medium layer 220 and a second protrusion 297b' provided at the center portion of the gain medium layer 220 may be defined in the upper portion of the gain medium layer 220. Although FIG. 12B illustrates an example in which the line-shaped trenches 297a are formed, one line-shaped trench 297a may be formed.

Although in the above-described exemplary embodiments the gain medium layer has a cylindrical or rectangular shape, the shape of the gain medium layer may be variously changed. Also, the resonant mode may be controlled by variously changing the number, length, angle, or shape of the trenches formed in the gain medium layer. For example, if the number of trenches is odd or even, an odd number of resonant modes or an even number of resonant modes may be generated. Compared to a case in which there is no trench, the number of resonant modes may be reduced to a half. Also, since the structure of a trench is optimized to a desired wavelength and mode, mode selection is possible. Also, since a desired resonant mode is separated from undesired resonant modes, a mode separation effect may be expected. A Q-factor of the semiconductor laser resonator may be improved due to a resonant mode confinement effect.

Figure 13A:
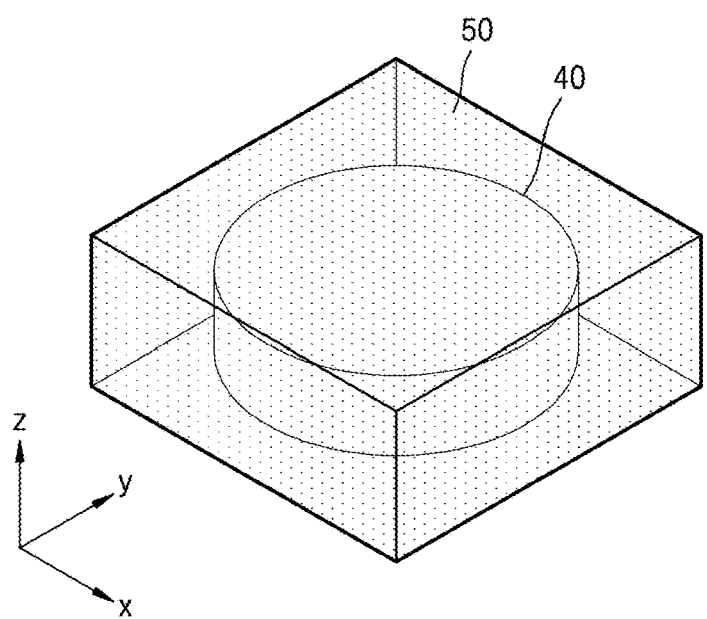
FIGS. 13A, 13B, and 13C illustrate a finite difference time domain (FDTD) simulation modeling structure of an existing semiconductor laser resonator.
Figure 13B:
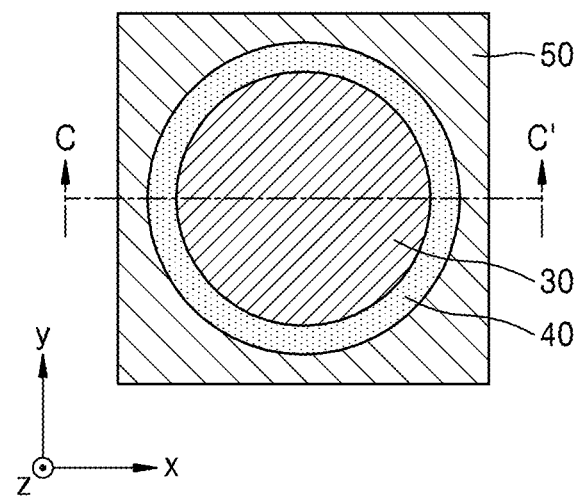
Figure 13C:
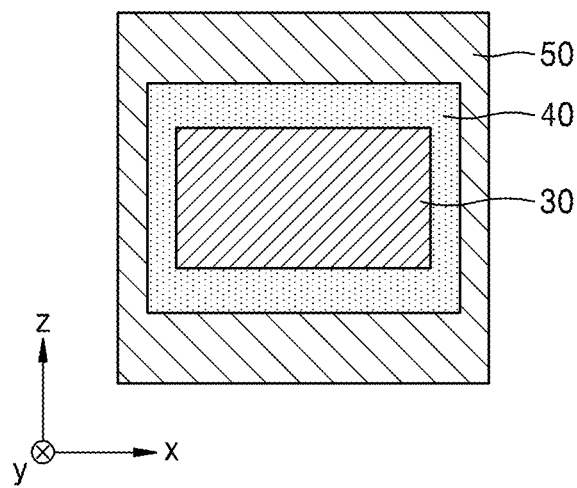

FIGS. 13A to 13C illustrate a finite difference time domain (FDTD) simulation modeling structure of an existing semiconductor laser resonator 30.

FIG. 13A is a perspective view that the existing semiconductor laser resonator 30 is surrounded by a SiO2 layer 40 and an Ag layer 50. FIG. 13B illustrates an interior of the structure of FIG. 13A. FIG. 13C is a cross-sectional view taken along line C-C' of FIG. 13B. Referring to FIGS. 13A to 13C, the existing semiconductor laser resonator 30 having a cylindrical shape is surrounded by the $SiO_2$ layer 40, and the $SiO_2$ layer 40 is surrounded by the Ag layer 50.

Figure 14:
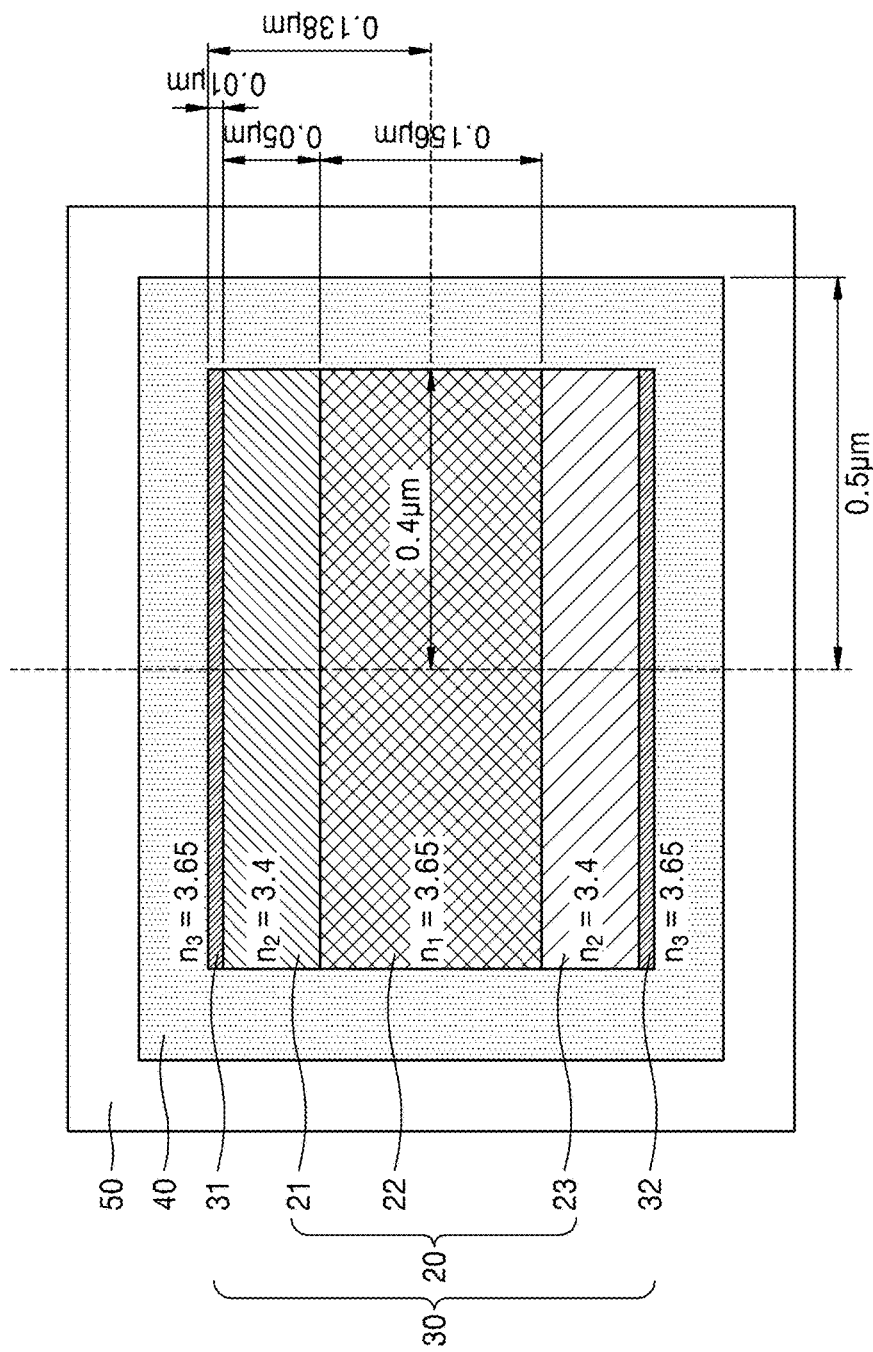
FIG. 14 is a cross-sectional view of an inner structure of the semiconductor laser resonator of FIGS. 13A, 13B, and 13C.

FIG. 14 is a cross-sectional view of an inner structure of the semiconductor laser resonator of FIGS. 13A to 13C.

Referring to FIG. 14, the existing semiconductor laser resonator 30 for modelling a FDTD simulation may include a gain medium layer 20 and first and second contact layers 31 and 32 respectively disposed on upper and lower surfaces of the gain medium layer 20. In this case, the gain medium layer 20 may include an active layer 22 and first and second clad layers 21 and 23 respectively disposed on upper and lower surfaces of the active layer 22. InGaAs having a refractive index n1 of 3.65 is used as the active layer 22, and p-AlGaAs and n-AlGaAs having a refractive index n2 of 3.4 are respectively used as the first and second clad layers 21 and 23. Although the active layer 22 generally has a quantum well structure, it is simplified for the purpose of a simulation. p-GaAs and n-GaAs having a refractive index n3 of 3.65 are used as the first and second contact layers 31 and 32. The thickness and radius of the existing semiconductor laser resonator 30 are about 0.276 μm and 0.4 μm, respectively. The $SiO_2$ layer 40 surrounds the outer edge of the existing semiconductor laser resonator 30 with a thickness of about 0.1 μm.

Figure 15:
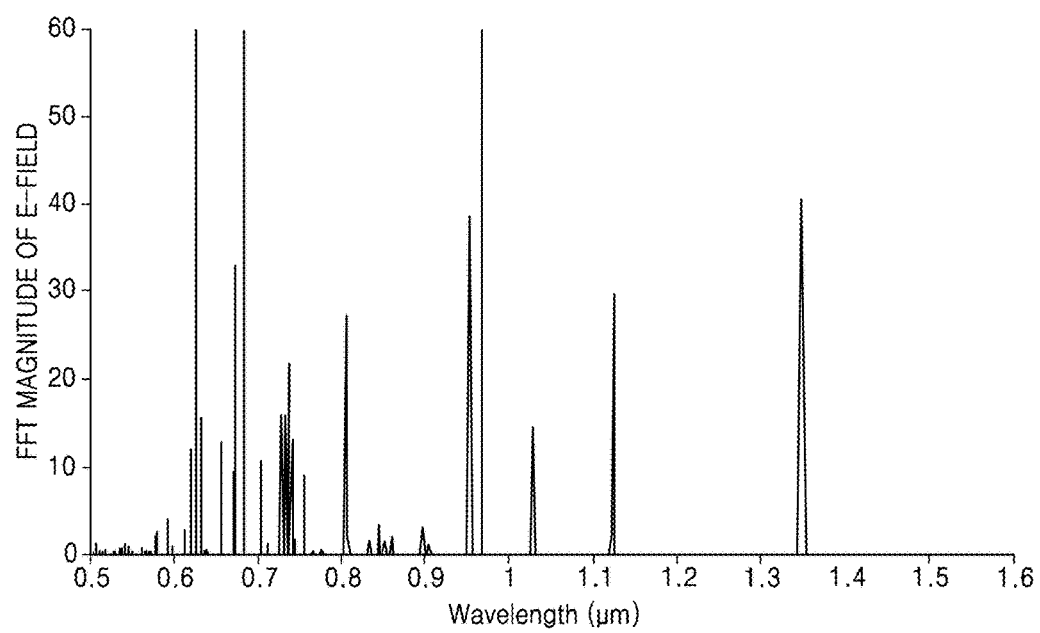
FIG. 15 is a graph showing a spectrum of a TE mode laser beam generated by the semiconductor laser resonator of FIGS. 13A, 13B, and 13C.

FIG. 15 is a graph showing a spectrum of a transverse (TE) mode laser beam generated by the existing semiconductor laser resonator 30 of FIGS. 13A to 13C. In detail, FIG. 15 illustrates a magnitude of a fast Fourier transform (FFT) of an electric field according to a wavelength of a TE mode laser beam. FIGS. 16A to 16G are images showing distributions of intensity of an electric field of a TE mode laser beam generated by the existing semiconductor laser resonator 30 of FIGS. 13A to 13C. In detail, FIGS. 16A to 16G illustrate distributions of intensity of an electric field according to a wavelength of a laser beam. In FIGS. 16A to 16G, a red area denotes an area in which the intensity of an electric field is strong, and a blue area denotes an area in which the intensity of an electric field is weak. FIG. 15 and FIGS. 16A to 16G illustrate a result obtained through a simulation when a magnetic dipole is set to be in a z-direction in the existing semiconductor laser resonator 30 of FIGS. 13A to 13C.

Figure 16A:
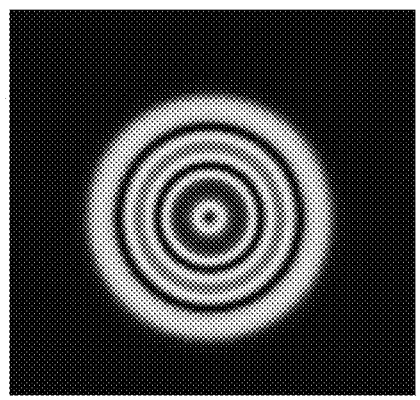
FIGS. 16A, 16B, 16C, 16D, 16E, 16F, and 16G are images showing distributions of intensity of an electric field of a TE mode laser beam generated by the semiconductor laser resonator of FIGS. 13A, 13B, and 13C.
Figure 16B:
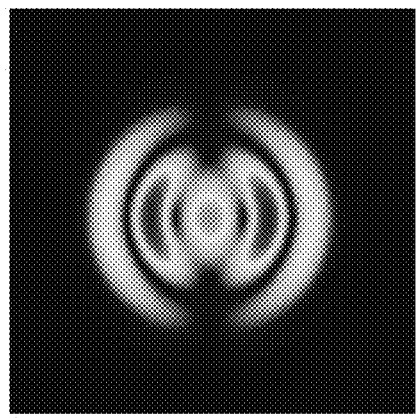
Figure 16C:
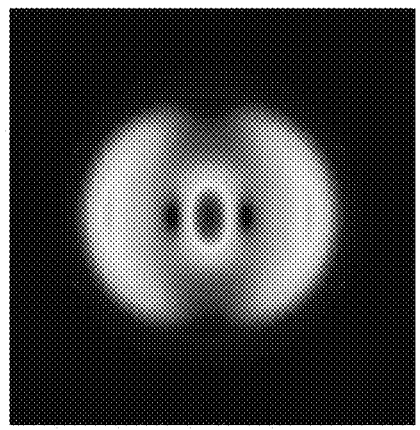
Figure 16D:
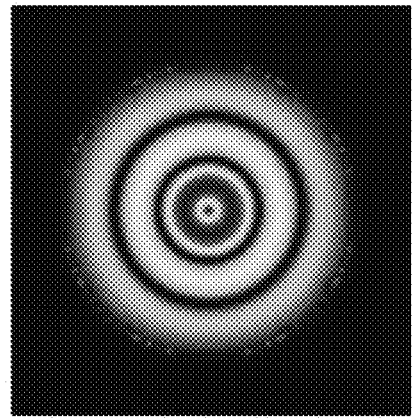
Figure 16E:
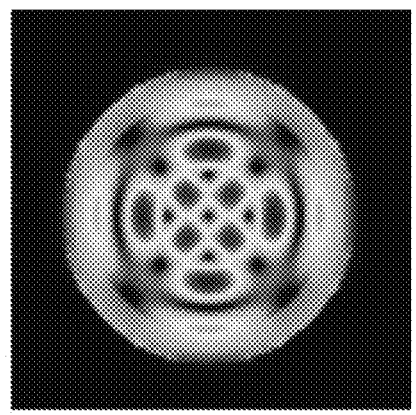
Figure 16F:
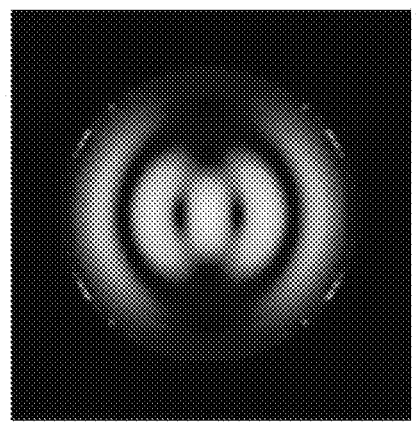
Figure 16G:
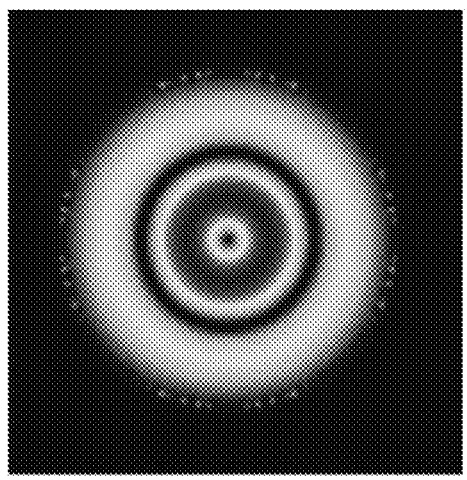

Referring to FIG. 15 and FIGS. 16A to 16G, TE resonant modes, for example, a 0.625695 μm wavelength of FIG. 16A, a 0.681405 μm wavelength of FIG. 16B, a 0.803571 μm wavelength of FIG. 16C, a 0.951777 μm wavelength of FIG. 16D, a 0.967326 μm wavelength of FIG. 16E, a 1.12164 μm wavelength of FIG. 16F, and a 1.34731 μm wavelength of FIG. 16G, may be generated by the existing semiconductor laser resonator 30 of FIGS. 13A to 13C. In this case, a TE resonant mode may signify a transverse electric mode representing an electromagnetic field in a resonator when an electric filed is generated perpendicularly to a travelling direction of an electromagnetic wave. Referring to FIG. 15 and FIGS. 16A to 16G, it may be seen that a plurality of TE resonant modes are generated in the existing semiconductor laser resonator 30. As illustrated in FIG. 15, a plurality of resonant modes are generated as a wavelength decreases and an interval between resonant modes increases as a wavelength increases.

Figure 17:
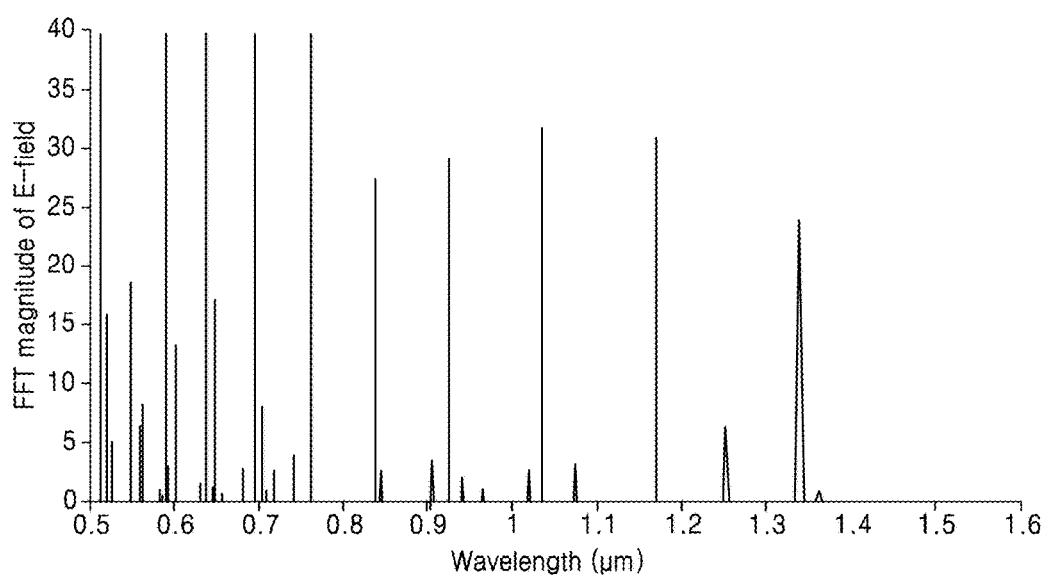
FIG. 17 is a graph showing a spectrum of a TM mode laser beam generated by the semiconductor laser resonator of FIGS. 13A, 13B, and 13C.

FIG. 17 is a graph showing a spectrum of a transverse (TM) mode laser beam generated by the existing semiconductor laser resonator 30 of FIG. 13A to FIG. 13C. FIG. 17 illustrates a result obtained through a simulation when an electric dipole is set to be in the z-direction in the existing semiconductor laser resonator 30 of FIGS. 13A to 13C. In this case, a TM resonant mode may signify a transverse magnetic resonant mode representing an electromagnetic field in a resonator when an electric filed is generated perpendicularly to a travelling direction of an electromagnetic wave. As illustrated in FIG. 17, a plurality of TM resonant modes are generated in the existing semiconductor laser resonator 30.

As such, since a plurality of resonant modes are generated in the existing semiconductor laser resonator 30 of FIGS. 13A to 13C, it is difficult to select a resonant mode of a desired wavelength among the plurality of resonant modes.

FIGS. 18A to 18D illustrate FDTD simulation modeling structures of a semiconductor laser resonator 330 according to an exemplary embodiment.

Figure 18A:
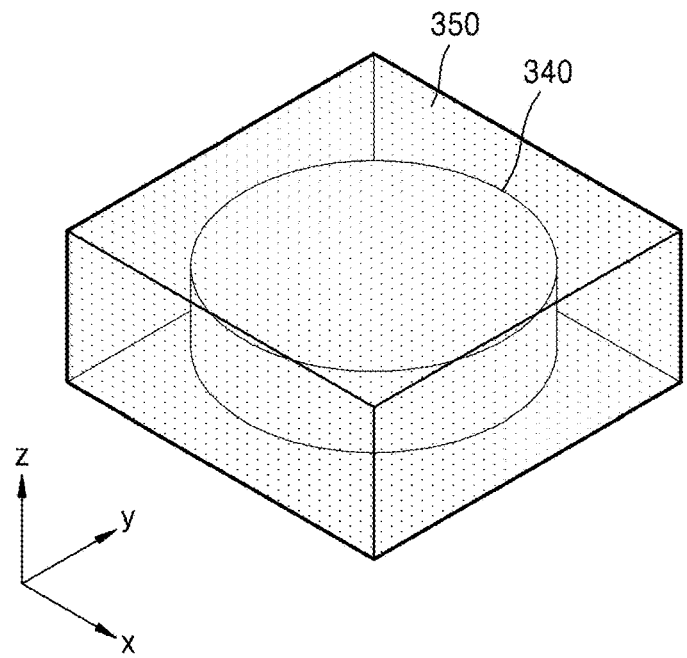
FIGS. 18A, 18B, 18C, and 18D illustrate a FDTD simulation modeling structure of a semiconductor laser resonator according to an exemplary embodiment.
Figure 18B:
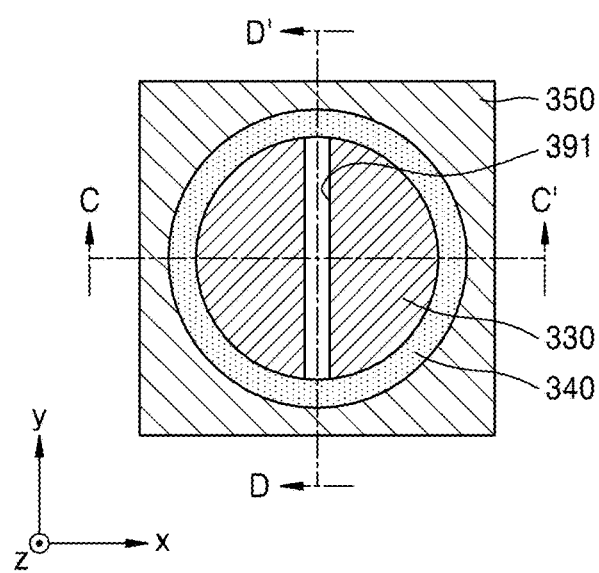
Figure 18C:
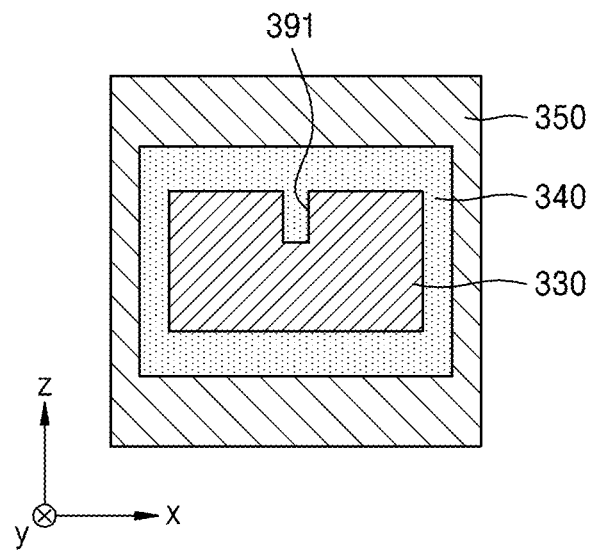
Figure 18D:
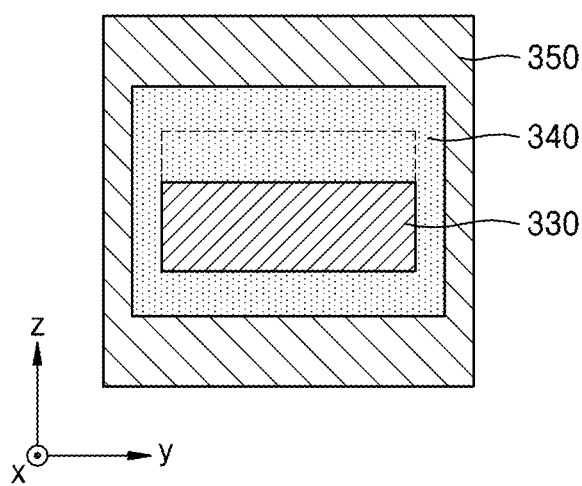

FIG. 18A is a perspective view of the semiconductor laser resonator 330 surrounded by a $SiO_2$ layer 340 and an Ag layer 350, according to an exemplary embodiment. FIG. 18B illustrates an interior of the structure of FIG. 18A. FIG. 18C is a cross-sectional view taken along line C-C' of FIG. 18B. FIG. 18D is a cross-sectional view taken along line D-D' of FIG. 18B. Referring to FIGS. 18A to 18D, the semiconductor laser resonator 330 has a cylindrical shape, and one trench 391 is formed in an upper portion of the semiconductor laser resonator 330. The semiconductor laser resonator 330 is surrounded by the $SiO_2$ layer 340, and the $SiO_2$ layer 340 is surrounded by the Ag layer 350.

Figure 19:
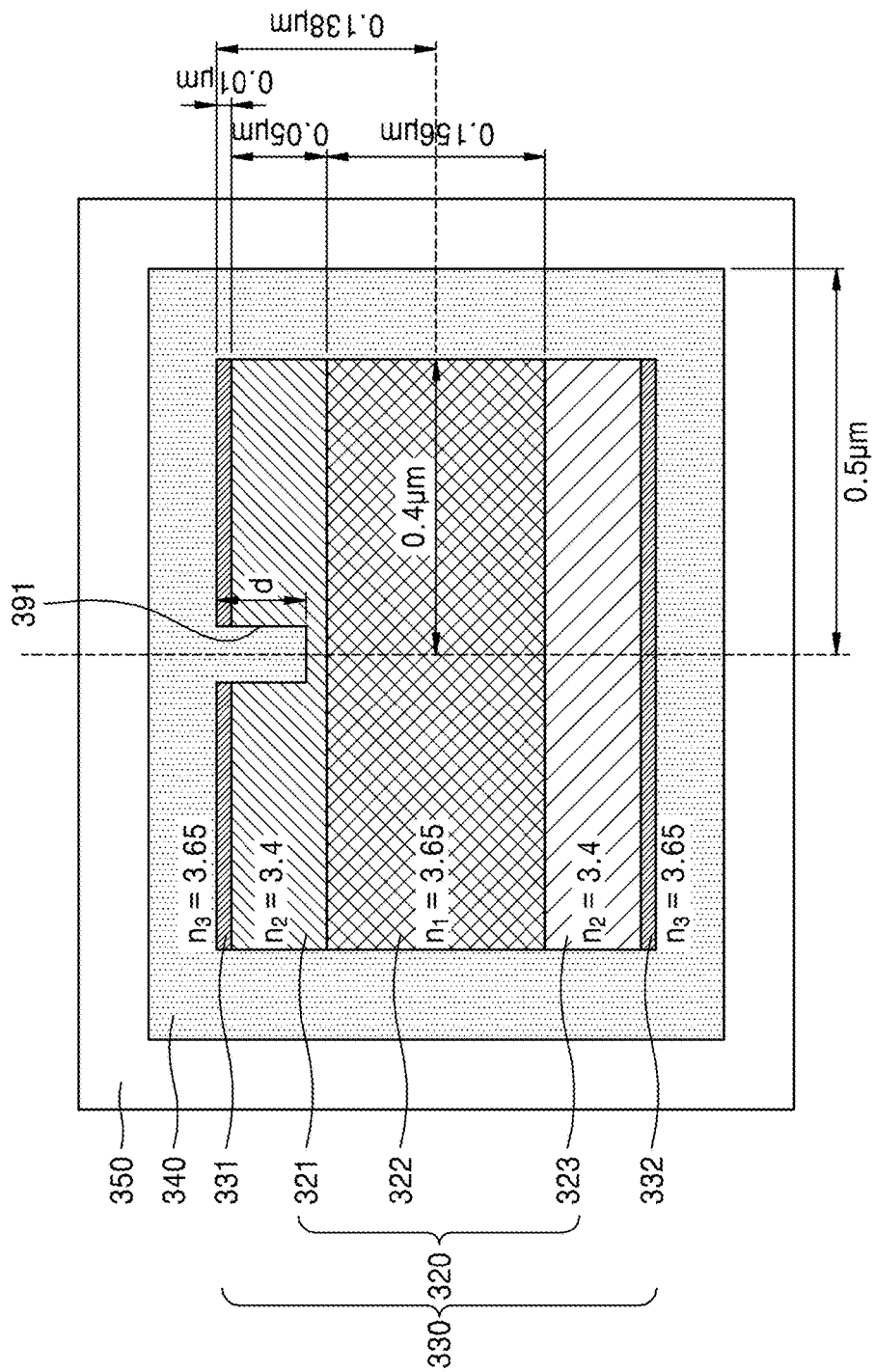
FIG. 19 is a cross-sectional view of an inner structure of the semiconductor laser resonator of FIGS. 18A, 18B, 18C, and 18D.

FIG. 19 is a cross-sectional view of an inner structure of the semiconductor laser resonator 330 of FIGS. 18A to 18D. The cross-sectional view of FIG. 19 is the same as that of 14, except that the trench 391 is formed in the upper portion of the semiconductor laser resonator 330.

Referring to FIG. 19, the semiconductor laser resonator 330 may include a gain medium layer 320 and first and second contact layers 331 and 332 respectively disposed on upper and lower surfaces of the gain medium layer 320. In this case, the gain medium layer 320 may include an active layer 322 and first and second clad layers 321 and 323 respectively disposed on upper and lower surfaces of the active layer 322. A line-shaped trench 391 is formed to a certain depth d in an upper portion of the semiconductor laser resonator 330. The trench 391 is filled with the $SiO_2$ layer 340.

Figure 20:
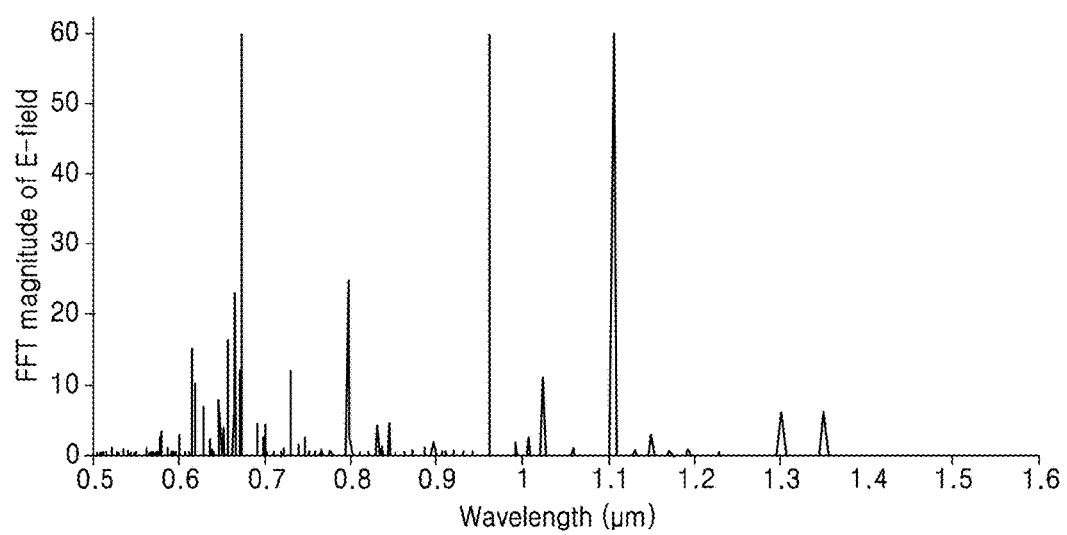
FIG. 20 is a graph showing a spectrum of a TE mode laser beam generated by the semiconductor laser resonator of FIGS. 18A, 18B, 18C, and 18D.

FIG. 20 is a graph showing a spectrum of a TE mode laser beam generated by the semiconductor laser resonator 330 of FIGS. 18A to 18D. In detail, FIG. 20 illustrates a magnitude of a FFT of an electric field according to a wavelength of a TE mode laser beam. FIGS. 21A to 21D are images showing distributions of intensity of an electric field of a TE mode laser beam generated by the semiconductor laser resonator 330 of FIGS. 18A to 18D. In detail, FIGS. 21A to 21D illustrate distributions of intensity of an electric field according to a wavelength of a laser beam. In FIGS. 21A to 21D, a red area denotes an area in which the intensity of an electric field is strong, and a blue area denotes an area in which the intensity of an electric field is weak. FIG. 20 and FIGS. 21A to 21D illustrate a result obtained through a simulation when the depth d of the trench 391 is set to be 0.138 µm and a magnetic dipole is set to be in the z-direction in the semiconductor laser resonator 330 of FIGS. 18A to 18D.

Figure 21A:
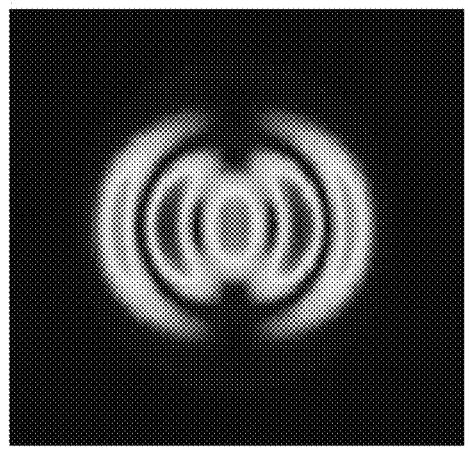
FIGS. 21A, 21B, 21C, and 21D are images showing distributions of intensity of an electric field of a TE mode laser beam generated by the semiconductor laser resonator of FIGS. 18A, 18B, 18C, and 18D.
Figure 21B:
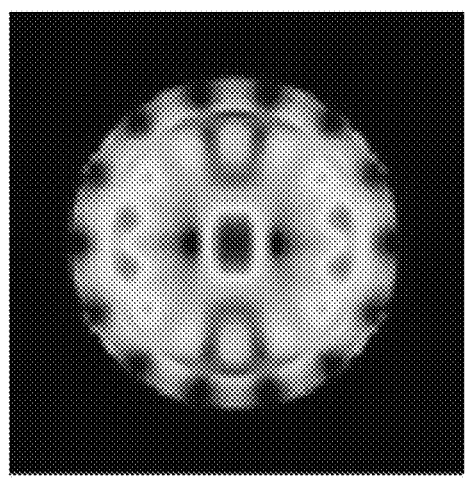
Figure 21C:
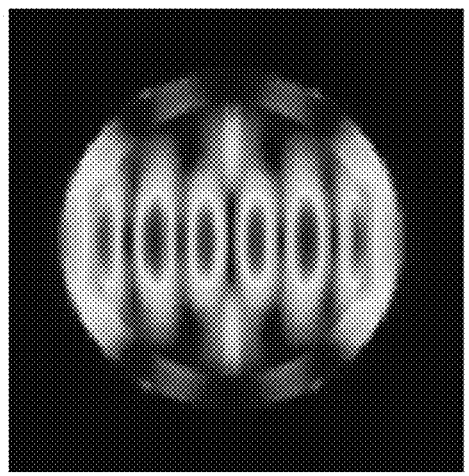
Figure 21D:
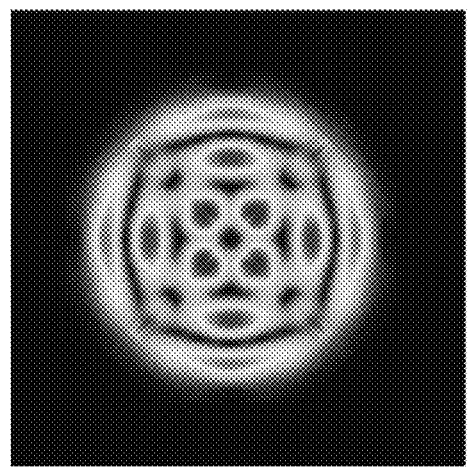

Referring to FIG. 20 and FIGS. 21A to 21D, TE resonant modes, for example, a 0.674056 µm wavelength of FIG. 21A, a 0.796742 µm wavelength of FIG. 21B, a 0.960717 µm wavelength of FIG. 21C, and a 1.10511 µm wavelength of FIG. 21D, may be generated by the semiconductor laser resonator 330 including the trench 391 of FIGS. 18A to 18D. As such, in the semiconductor laser resonator 330 including the trench 391, resonant modes are changed compared to the existing semiconductor laser resonator 30 of FIG. 13A to FIG. 13C. For example, a resonance wavelength or resonance intensity may be changed, and in some cases, a specific resonant mode may be perished. This is because an even-numbered resonant mode is perished since the semiconductor laser resonator 330 of FIGS. 18A to 18D includes the trench 391. Also, the resonant modes are changed due to a change in a boundary condition by the trench 391.

In detail, when FIG. 15 and FIG. 20 are compared with each other, since a TE resonant mode of a 1.34731 µm wavelength, a TE resonant mode of a 0.951777 µm wavelength, and a TE resonant mode of a 0.625695 µm wavelength, which are generated by the existing semiconductor laser resonator 30 of FIGS. 13A to 13C, are not suitable for a trench structure, these TE resonant modes are perished from the semiconductor laser resonator 330 of FIGS. 18A to 18D. A TE resonant mode of a 1.12164 µm wavelength generated by the existing semiconductor laser resonator 30 is slightly shifted to have a resonance wavelength of 1.10511 µm in the semiconductor laser resonator 330 of FIGS. 18A to 18D, and is increased in a magnitude of spectrum. As such, since the trench 391 is formed in the semiconductor laser resonator 330, resonance properties may be changed. Accordingly, undesired neighboring resonant modes may be removed, leaving a desired resonant mode only, or may be separated from the desired resonant mode.

Figure 22:
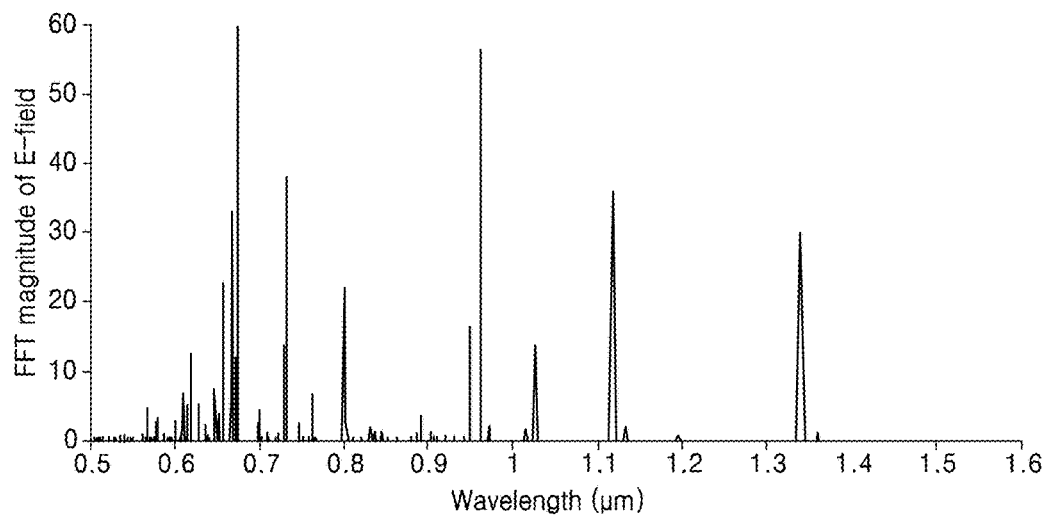
FIG. 22 is a graph showing a spectrum of a TE mode laser beam generated by the semiconductor laser resonator of FIGS. 18A, 18B, 18C, and 18D.

FIG. 22 is a graph showing a spectrum of a TE mode laser beam generated by the semiconductor laser resonator 330 of FIGS. 18A to 18D. In detail, FIG. 22 illustrates a result obtained through a simulation when the depth d of the trench 391 is set to be 0.06 µm in the semiconductor laser resonator 330 of FIGS. 18A to 18D.

The spectrum of the TE mode laser beam of FIG. 22 is different from the spectrum of the TE mode laser beam of FIG. 20 in the wavelengths or amounts of the TE resonant modes. This difference is generated since the depth of the trench 391 in the semiconductor laser resonator 330 of FIGS. 18A to 18D is changed from 0.138 µm to 0.06 µm. As such, the TE resonant modes may be adjusted by changing the depth of the trench 391 in the semiconductor laser resonator 330 of FIGS. 18A to 18D.

Figure 23A:
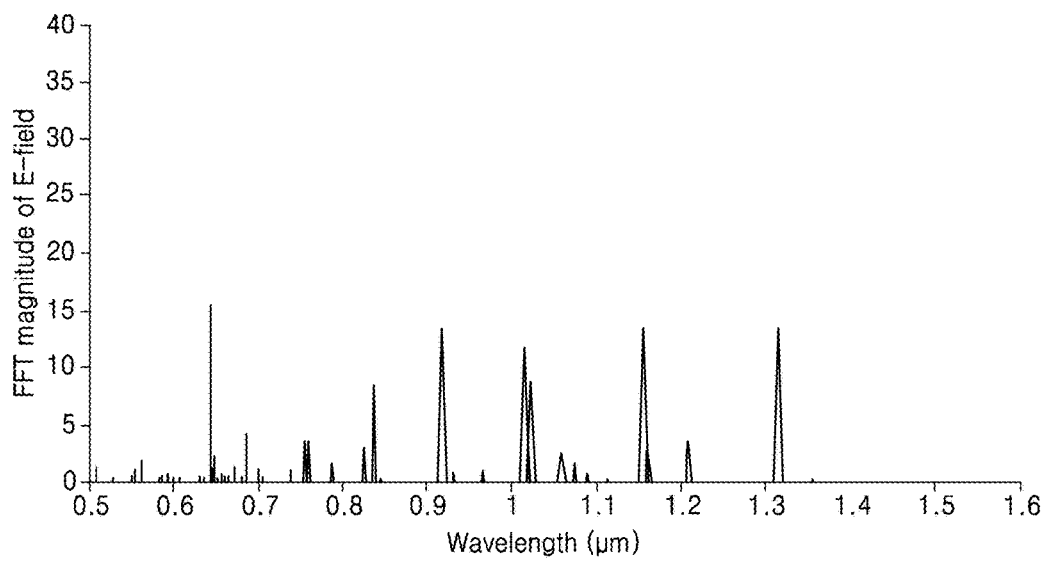
FIGS. 23A and 23B are graphs showing spectrums of a TM mode laser beam generated by the semiconductor laser resonator of FIGS. 18A, 18B, 18C, and 18D.
Figure 23B:
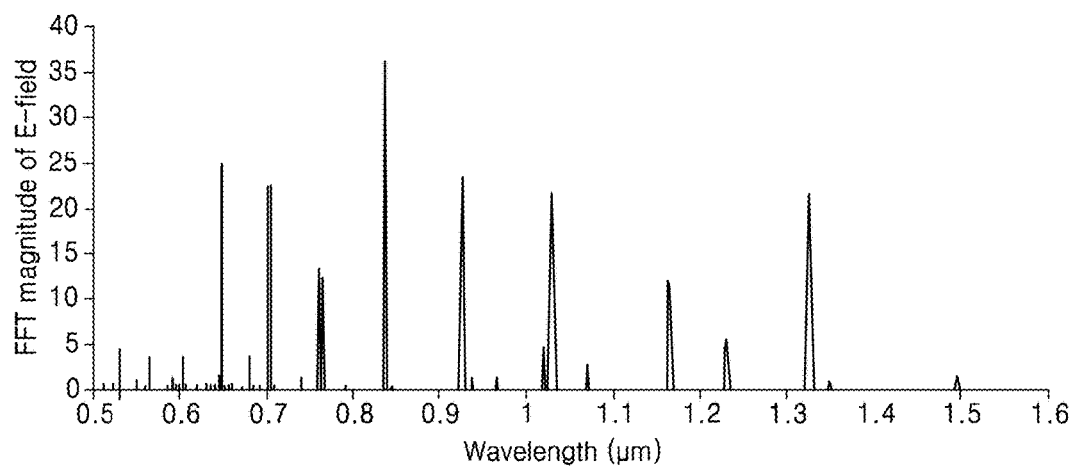

FIGS. 23A and 23B are graphs showing spectrums of a TM mode laser beam generated by the semiconductor laser resonator 330 of FIGS. 18A to 18D. FIG. 23A illustrates a result obtained through a simulation when the depth d of the trench 391 is set to be 0.138 µm and an electric dipole is set to be in the z-direction in the semiconductor laser resonator 330 of FIGS. 18A to 18D. FIG. 23B illustrates a result obtained through a simulation when the depth d of the trench 391 is set to be 0.06 µm and an electric dipole is set to be in the z-direction in the semiconductor laser resonator 330 of FIGS. 18A to 18D.

When FIG. 17 and FIG. 23A are compared with each other, in the TM resonant modes generated by the existing semiconductor laser resonator 30 and the TM resonant modes generated by the semiconductor laser resonator 330 of FIGS. 18A to 18D, the magnitude of spectrum is changed though there is no big change in the wavelength. Also, when FIGS. 23A and 23B are compared with each other, in the semiconductor laser resonator 330 of FIGS. 18A to 18D, the TM resonant modes and the amount of spectrum are changed as the depth d of the trench 391 is changed.

FIGS. 24A to 24D illustrate FDTD simulation modeling structures of a semiconductor laser resonator according to another exemplary embodiment.

Figure 24A:
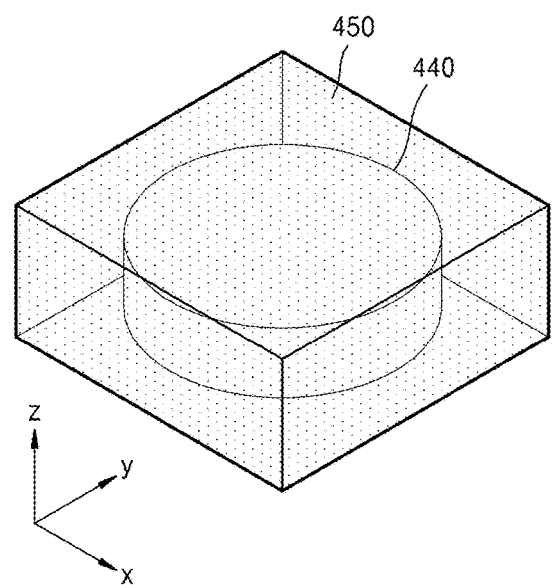
FIGS. 24A, 24B, 24C, and 24D illustrate FDTD simulation modeling structures of a semiconductor laser resonator according to another exemplary embodiment.
Figure 24B:
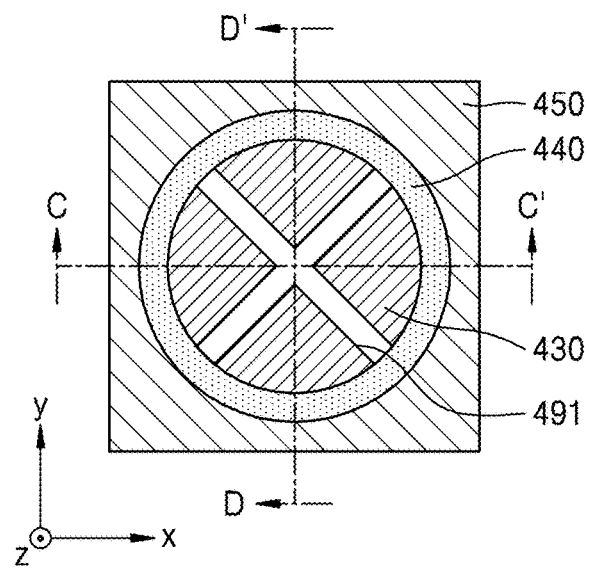
Figure 24C:
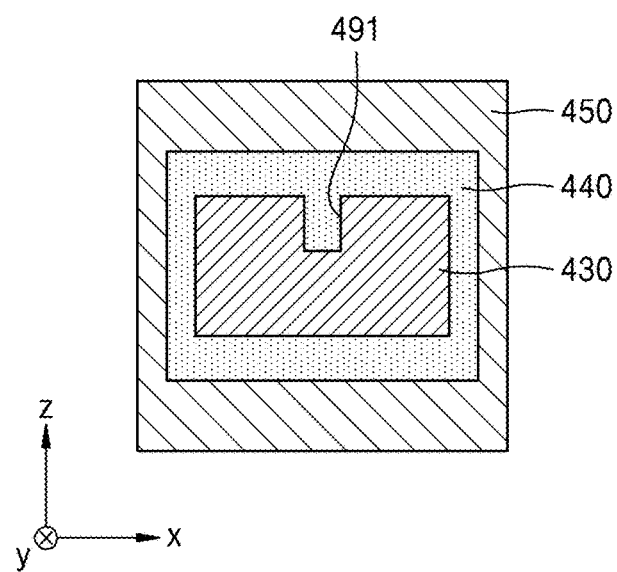
Figure 24D:
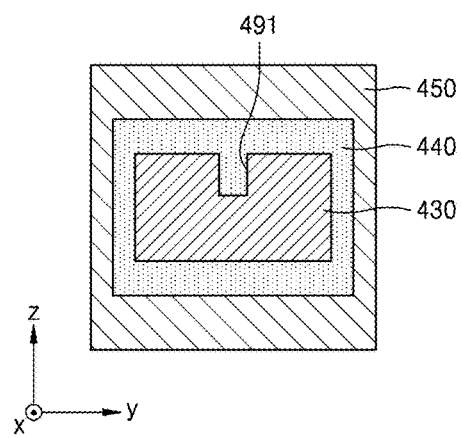

FIG. 24A is a perspective view of a semiconductor laser resonator 430 being surrounded by a $SiO_2$ layer 440 and an Ag layer 450, according to another exemplary embodiment. FIG. 24B illustrates an interior of the structure of FIG. 24A. FIG. 24C is a cross-sectional view taken along line C-C' of FIG. 24B. FIG. 24D is a cross-sectional view taken along line D-D' of FIG. 24B. Referring to FIGS. 24A to 24D, two line-shaped trenches 491 intersecting with each other are formed in an upper portion of a semiconductor laser resonator 430 having a cylindrical shape. The semiconductor laser resonator 430 is surrounded by the $SiO_2$ layer 440, and the $SiO_2$ layer 440 is surrounded by the Ag layer 450. The cross-section of the semiconductor laser resonator 430 of FIGS. 24A to 24D is the same as that of the semiconductor laser resonator 330 of FIG. 19, except that two trenches 491 are formed in an upper portion of the semiconductor laser resonator 430.

Figure 25:
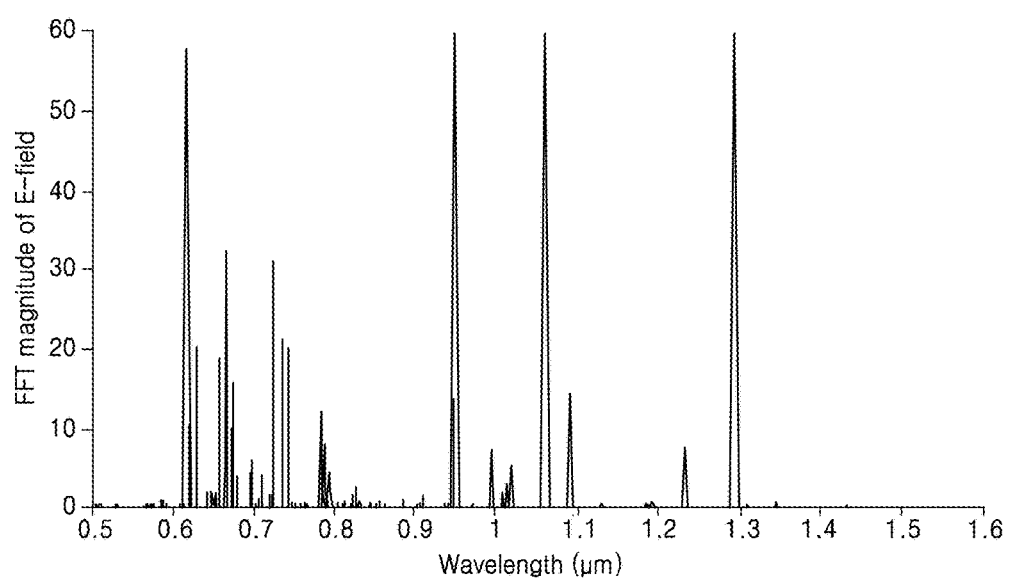
FIG. 25 is a graph showing a spectrum of a TE mode laser beam generated by the semiconductor laser resonator of FIGS. 24A, 24B, 24C, and 24D.

FIG. 25 is a graph showing a spectrum of a TE mode laser beam generated by the semiconductor laser resonator 430 of FIGS. 24A to 24D. In detail, FIG. 25 illustrates a magnitude of a FFT of an electric field according to a wavelength of a TE mode laser beam. FIGS. 26A to 26F are images showing distributions of intensity of an electric field of a TE mode laser beam generated by the semiconductor laser resonator 430 of FIGS. 24A to 24D. In detail, FIGS. 26A to 26F illustrate distributions of intensity of an electric field according to a wavelength of a laser beam. In FIGS. 26A to 26F, a red area denotes an area in which the intensity of an electric field is strong, and a blue area denotes an area in which the intensity of an electric field is weak. FIG. 25 and FIGS. 26A to 26F illustrate a result obtained through a simulation when the depth of each of the trenches 491 is set to be 0.138 µm and a magnetic dipole is set to be in the z-direction in the semiconductor laser resonator 430 of FIGS. 24A to 24D.

Figure 26A:
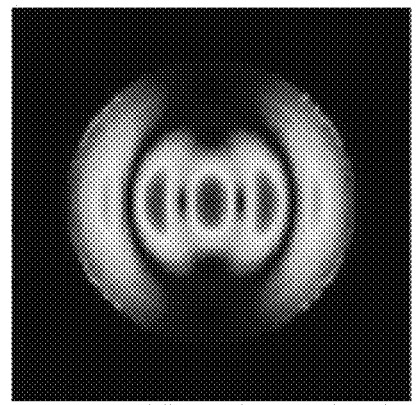
FIGS. 26A, 26B, 26C, 26D, 26E and 26F are images showing distributions of intensity of an electric field of a TE mode laser beam generated by the semiconductor laser resonator of FIGS. 24A, 24B, 24C, and 24D.
Figure 26B:
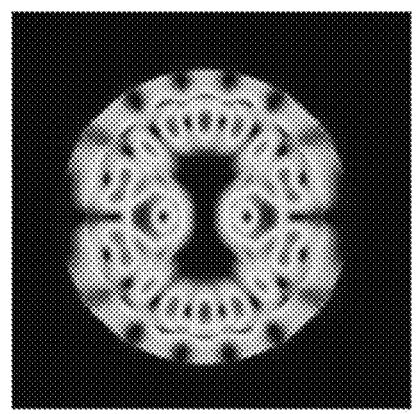
Figure 26C:
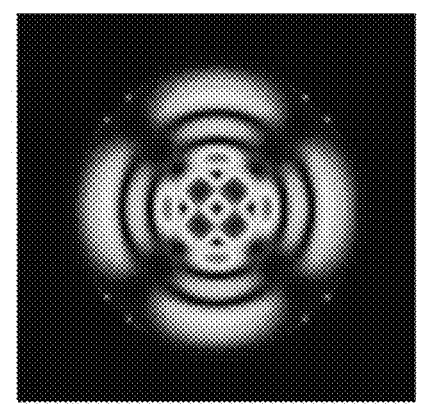
Figure 26D:
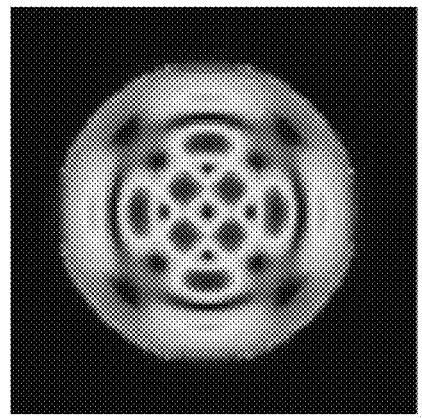
Figure 26E:
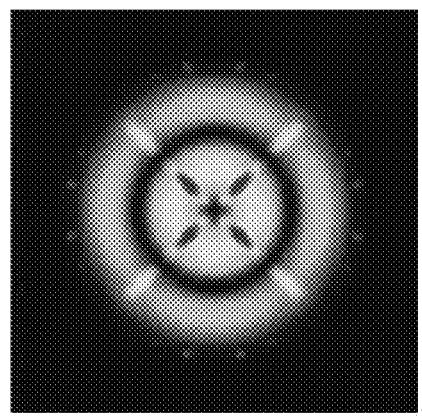
Figure 26F:
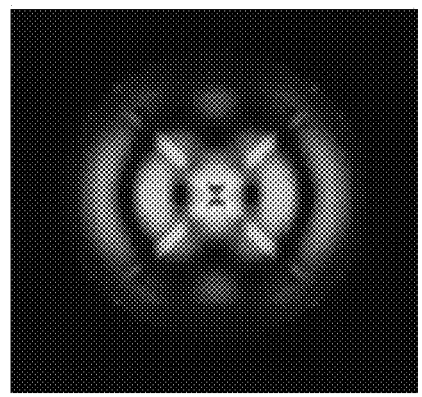

Referring to FIG. 25 and FIGS. 26A to 26F, TE resonant modes, for example, a 0.616438 µm wavelength of FIG. 26A, a 0.665287 µm wavelength of FIG. 26B, a 0.72208 µm wavelength of FIG. 26C, a 0.947767 µm wavelength of FIG. 26D, a 1.06032 µm wavelength of FIG. 26E, and a 1.29162 µm wavelength of FIG. 26F, may be generated by the semiconductor laser resonator 430 of FIGS. 24A to 24D. As such, compared to the semiconductor laser resonator 330 including the one trench 391, a change in the TE resonant mode occurs more severely in the semiconductor laser resonator 430 including the two trenches 491. In other words, a wavelength of a TE resonant mode may be severely shifted, and a new TE resonant mode, for example, a resonant mode of a 1.06032 µm wavelength, which has not been generated in the existing semiconductor laser resonator 30, may be generated. A TE resonant mode of a 0.947767 μm wavelength has a less change in the resonant mode, compared to other resonant modes. This shows that the resonance properties of the TE resonant mode of a 0.947767 μm wavelength is not much affected by a change in the depths of the two trenches 491. As such, in the semiconductor laser resonator 430 including the two trenches 491, a desired TE resonant mode may be easily selected and undesired neighboring TE resonant modes may be removed or may be separated from the desired TE resonant mode.

Figure 27:
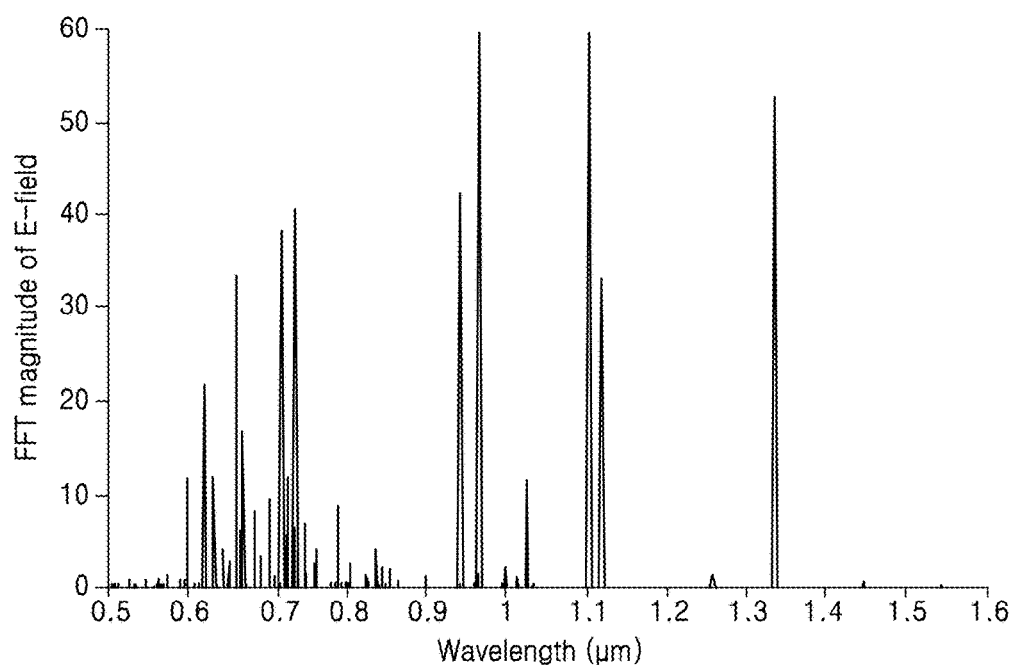
FIG. 27 is a graph showing a spectrum of a TE mode laser beam generated by the semiconductor laser resonator of FIGS. 24A, 24B, 24C, and 24D.

FIG. 27 is a graph showing a spectrum of a TE mode laser beam generated by the semiconductor laser resonator 430 of FIGS. 24A to 24D. In detail, FIG. 27 illustrates a result obtained through a simulation when the depth of each of the trenches 491 is set to be 0.06 μm in the semiconductor laser resonator 430 of FIGS. 24A to 24D.

The TE mode laser beam of FIG. 27 is different from the spectrum of the TE mode laser beam of FIG. 25 in the wavelengths or magnitudes of the TE resonant modes. This difference is generated since the depth of each of the trenches 491 in the semiconductor laser resonator 430 of FIGS. 24A to 24D is changed from 0.138 μm to 0.06 μm. As such, the TE resonant modes may be adjusted by changing the depth of each of the trenches 491 in the semiconductor laser resonator 430 of FIGS. 24A to 24D.

Figure 28A:
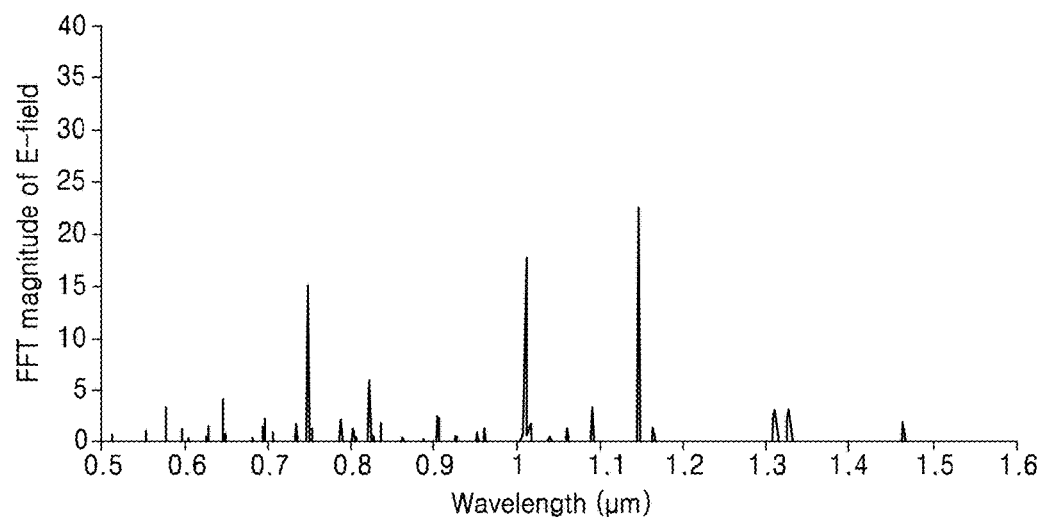
FIGS. 28A and 28B are graphs showing spectrums of a TM mode laser beam generated by the semiconductor laser resonator of FIGS. 24A, 24B, 24C, and 24D.
Figure 28B:
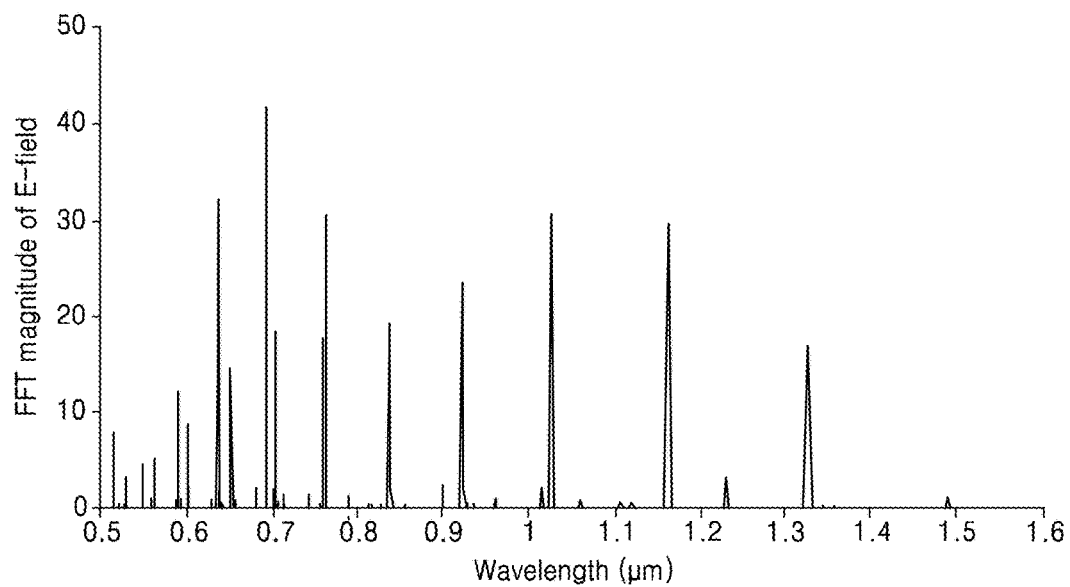

FIGS. 28A and 28B are graphs showing spectrums of a TM mode laser beam generated by the semiconductor laser resonator 430 of FIGS. 24A to 24D. FIG. 28A illustrates a result obtained through a simulation when the depth of each of the trenches 491 is set to be 0.138 μm and an electric dipole is set to be in the z-direction in the semiconductor laser resonator 430 of FIGS. 24A to 24D. FIG. 28B illustrates a result obtained through a simulation when the depth of each of the trenches 491 is set to be 0.06 μm and an electric dipole is set to be in the z-direction in the semiconductor laser resonator 430 of FIGS. 24A to 24D.

When FIG. 17 and FIG. 28A are compared with each other, the TM resonant modes generated by the existing semiconductor laser resonator 30 are different from the TM resonant modes generated by the semiconductor laser resonator 430 including the two trenches 491 of FIGS. 24A to 24D in the wavelengths and magnitudes of spectrums of the resonant modes. Also, when FIG. 28A and FIG. 28B are compared with each other, the TM resonant modes and the magnitudes of spectrums may be changed by changing the depth of each of the two trenches 491 in the semiconductor laser resonator 430 of FIGS. 24A to 24D.

As described above, since at least one trench is formed in an upper portion of a semiconductor laser resonator, a laser beam generated from a gain medium layer may be confined as a standing wave in protrusions defined by the trench. In this case, resonant modes may be adjusted by changing the number, length, angle, or shape of the trench. Since a structure of the trench is optimized for a desired wavelength and mode, mode selection is possible and thus a mode selection effect may be expected by separating a desired resonant mode from an undesired resonant mode. Also, a Q-factor of the semiconductor laser resonator may be improved by a resonant mode confinement effect.

According to the above-described exemplary embodiments, since at least one trench is formed in an upper portion of a gain medium layer in a nano-sized or micro-sized semiconductor laser resonator, a laser beam generated from the gain medium layer may be confined as a standing wave in at least one protrusion defined by the trench. Accordingly, the semiconductor laser resonator may be operated at a desired wavelength in a desired resonant mode. Also, resonant modes may be selectively separated by removing an undesired neighboring resonant mode or separating a desired resonant mode from the undesired neighboring resonant mode. Also, intensity of only a desired resonant mode may be reinforced. A TE resonant mode or a TM resonant mode may be adjusted by adjusting the shape, number, length, direction, or angle of the trench formed in the gain medium layer. A laser beam generated from the gain medium layer may be efficiently confined by providing a metal layer or a dielectric layer having a refractive index different form that of the gain medium layer outside the gain medium layer. The nano-scale semiconductor laser resonator including the trench may be manufactured using delicate patterning by, for example, e-beam lithography, focused ion beam (FIB), or KrF type photolithography.

As described above, a semiconductor laser resonator which easily controls a resonant mode may be used for various fields. For example, an ultrafast, low-powered, and compact on-chip photonic integrated circuit (IC) may be manufactured by embodying a light source in a nano laser resonator. Also, if a nano laser resonator is used as an optical signal transmitting device, high-speed data transmission is available. Also, optical through-silicon via (TSV) capable of transmitting signals at high speed and solving a heating problem may be embodied. A nano laser resonator may be used as a high-precision, high-speed optical clock source that is compatible with a complementary metal-oxide-semiconductor (CMOS).

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the appended claims.

What is claimed is:

1. A semiconductor laser resonator configured to generate a laser beam, the semiconductor laser resonator comprising:
a gain medium layer including a semiconductor material and comprising at least one protrusion formed by at least one trench to protrude in an upper portion of the gain medium layer,
wherein the at least one trench is formed symmetrically with respect to a center of the gain medium layer, in the upper portion of the gain medium layer and is formed to connect each other, and
wherein the at least one protrusion is configured to confine the laser beam as a standing wave in the at least one protrusion.

2. The semiconductor laser resonator of claim 1, further comprising a metal layer provided outside the gain medium layer, the metal layer being configured to confine the laser beam generated from the gain medium layer.

3. The semiconductor laser resonator of claim 2, further comprising a buffer layer provided between the gain medium layer and the metal layer, the buffer layer being configured to buffer an optical loss of the laser beam generated from the gain medium layer.

4. The semiconductor laser resonator of claim 1, further comprising a dielectric layer provided outside the gain medium layer, the dielectric layer being configured to confine the laser beam generated from the gain medium layer and having a refractive index different from a refractive index of the gain medium layer.

5. The semiconductor laser resonator of claim 1, wherein a lower portion of the gain medium layer is configured to further confine the laser beam therein.

6. The semiconductor laser resonator of claim 1, wherein the gain medium layer is cylindrical shaped or rectangular shaped.

7. The semiconductor laser resonator of claim 1, wherein each of the at least one trench has at least one planar shape selected from a line shape, a circular shape, a polygonal shape, and a ring shape.

8. The semiconductor laser resonator of claim 1, wherein the at least one protrusion comprises at least one first protrusion arranged along an outer edge of the gain medium layer.

9. The semiconductor laser resonator of claim 8, wherein the at least one protrusion further comprises at least one second protrusion arranged inwardly from the at least one first protrusion.

10. The semiconductor laser resonator of claim 1, wherein the gain medium layer comprises an active layer.

11. The semiconductor laser resonator of claim 10, wherein the active layer comprises at least one of a group III-V semiconductor material, a group II-VI semiconductor material, and quantum dots.

12. The semiconductor laser resonator of claim 10, wherein the gain medium layer further comprises a first clad layer disposed on a first surface of the active layer and a second clad layer disposed on a second surface of the active layer.

13. The semiconductor laser resonator of claim 1, further comprising:
a first contact layer disposed on a first surface of the gain medium layer; and
a second contact layer disposed on a second surface of the gain medium layer.

14. The semiconductor laser resonator of claim 13, wherein the first contact layer corresponds to the at least one protrusion.

15. The semiconductor laser resonator of claim 13, wherein the first contact layer and the second contact layer have a shape corresponding to a shape of the gain medium layer.

16. A semiconductor laser device comprising:
a substrate; and
a semiconductor laser resonator provided on the substrate and configured to generate a laser beam by absorbing energy,
wherein the semiconductor laser resonator comprises a gain medium layer including a semiconductor material and comprising at least one protrusion formed by at least one trench to protrude in an upper portion of the gain medium layer,
wherein the at least one trench is formed symmetrically with respect to a center of the gain medium layer, in the upper portion of the gain medium layer and is formed to connect each other, and wherein the at least one protrusion is configured to confine the laser beam as a standing wave in the at least one protrusion.

17. The semiconductor laser device of claim 16, wherein the semiconductor laser resonator further comprises a metal layer provided outside the gain medium layer, the metal layer being configured to confine the laser beam generated from the gain medium layer.

18. The semiconductor laser device of claim 17, wherein the semiconductor laser resonator further comprises a buffer layer provided between the gain medium layer and the metal layer, the buffer layer being configured to buffer an optical loss of the laser beam generated from the gain medium layer.

19. The semiconductor laser device of claim 16, wherein the semiconductor laser resonator further comprises a dielectric layer provided outside the gain medium layer, the dielectric layer being configured to confine the laser beam generated from the gain medium layer and having a refractive index different from a refractive index of the gain medium layer.

20. The semiconductor laser device of claim 16, wherein each of the at least one trench has at least one planar shape selected from a line shape, a circular shape, a polygonal shape, and a ring shape.

21. The semiconductor laser device of claim 16, wherein the at least one protrusion comprises at least one first protrusion arranged along an outer edge of the gain medium layer.

22. The semiconductor laser device of claim 21, wherein the at least one protrusion further comprises at least one second protrusion arranged inwardly from the at least one first protrusion.

23. The semiconductor laser device of claim 16, wherein the gain medium layer comprises an active layer.

24. The semiconductor laser device of claim 23, wherein the active layer comprises at least one of a group III-V semiconductor material, a group II-VI semiconductor material, and quantum dots.

25. The semiconductor laser device of claim 23, wherein the gain medium layer further comprises a first clad layer disposed on a first surface of the active layer and a second clad layer disposed on a second surface of the active layer.

26. The semiconductor laser device of claim 16, further comprising:
a first contact layer disposed on a first surface of the gain medium layer; and
a second contact layer disposed on a second surface of the gain medium layer.

27. The semiconductor laser resonator of claim 26, wherein the first contact layer and the second contact layer have a shape corresponding to a shape of the gain medium layer.

28. The semiconductor laser device of claim 26, further comprising a plurality of electrodes electrically connected to the first contact layer and the second contact layer.

* * * * *